United States Patent
Cha et al.

(10) Patent No.: US 8,957,732 B2
(45) Date of Patent: Feb. 17, 2015

(54) AMPLIFIER AND TRANSCEIVER INCLUDING THE AMPLIFIER

(75) Inventors: Hyouk Kyu Cha, Singapore (SG); Yuan Gao, Singapore (SG); Xiaojun Yuan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 143 days.

(21) Appl. No.: 13/699,867

(22) PCT Filed: May 25, 2011

(86) PCT No.: PCT/SG2011/000192
§ 371 (c)(1),
(2), (4) Date: Mar. 7, 2013

(87) PCT Pub. No.: WO2011/149426
PCT Pub. Date: Dec. 1, 2011

(65) Prior Publication Data
US 2013/0169364 A1   Jul. 4, 2013

(30) Foreign Application Priority Data

May 25, 2010 (SG) ............................. 201003634-1

(51) Int. Cl.
*H03F 3/18* (2006.01)
*H03F 3/16* (2006.01)
*H03F 1/22* (2006.01)
(Continued)

(52) U.S. Cl.
CPC ................ *H03F 3/16* (2013.01); *H03F 1/223* (2013.01); *H03F 3/193* (2013.01); *H03F 3/3028* (2013.01); *H03F 3/45179* (2013.01); *H03F 3/45071* (2013.01); *H03F 2200/294* (2013.01); *H03F 2200/408* (2013.01); *H03F 2200/451* (2013.01); *H03F 2200/492* (2013.01); *H03F 2203/30078* (2013.01); *H03F 2203/30081* (2013.01); *H03F 2203/30111* (2013.01); *H03F 2203/30114* (2013.01); *H03F 2203/45646* (2013.01)
USPC ....................................... 330/264; 330/207 A

(58) Field of Classification Search
USPC ....................................... 330/264, 207 A, 251
See application file for complete search history.

(56) References Cited

U.S. PATENT DOCUMENTS 4,158,843 A * 6/1979 Kuchy ......................... 342/448
4,229,705 A   10/1980 Takahashi et al.
(Continued)

OTHER PUBLICATIONS

Patel, et al., Applications, Challenges, and Prospective in Emerging Body Area Networking Technologies, 17 IEEE Wireless Communications, 80 (2010).
(Continued)

*Primary Examiner* — Henry Choe
(74) *Attorney, Agent, or Firm* — K. David Crockett, Esq.; Niky Economy Syrengelas, Esq.; Crockett & Crockett, PC

(57) ABSTRACT

An amplifier and a transceiver including the amplifier are provided. The amplifier includes an input terminal; a first transistor of a first conductivity and a second transistor of a second conductivity, each transistor comprising a source terminal, a gate terminal and a drain terminal respectively, the source terminal of the first transistor being coupled to the source terminal of the second transistor, and the gate terminal of the first transistor and the gate terminal of the second transistor being coupled to the input terminal; and an output terminal coupled to the drain terminal of the first transistor and the drain terminal of the second transistor.

17 Claims, 22 Drawing Sheets

(51) Int. Cl.
   *H03F 3/193* (2006.01)
   *H03F 3/30* (2006.01)
   *H03F 3/45* (2006.01)

(56) References Cited

U.S. PATENT DOCUMENTS

| | | | |
|---|---|---|---|
| 4,743,860 A * | 5/1988 | Dziagwa | 330/251 |
| 7,324,791 B2 | 1/2008 | Nakatani et al. | |
| 7,362,175 B2 * | 4/2008 | Arques | 330/264 |
| 7,705,674 B2 * | 4/2010 | McMorrow | 330/251 |
| 2002/0084855 A1 | 7/2002 | Kwon et al. | |
| 2004/0026760 A1 | 2/2004 | Dessard et al. | |
| 2010/0041361 A1 | 2/2010 | Ojo | |

OTHER PUBLICATIONS

Hui, et al., A 700-uW Single-Chip IC for Wireless Continuous-Time Health Monitoring in 0.18-um CMOS, IEEE Asian Solid-State Circuits Conference, 361 (2009).

Wong, et al., A 1V Wireless Transceiver for an Ultra-Low-Power SoC for Biotelemetry Applications, 43 IEEE Journal of Solid-State Circuits, 1511 (2008).

Do, et al., A Subthreshold Low-Noise Amplifier Optimized for Ultra-Low Power Applications in the ISM band, 56 IEEE Transactions on Microwave Theory and Techniques, 286 (2008).

Peiris, et al., A 1V 433/868 MHz 25kb/s-FSK 2kb/s-OOK RF Transceiver SoC in Standard Digital 0.18um CMOS, 2005 IEEE International Solid-State Circuits Conference, 258 (2005).

Sun, et al., CMOS RF Biosensor Utilizing Nuclear Magnetic Resonance, 44 IEEE Journal of Solid-State Circuits, 1629 (2009).

Goo, et al., A Noise Optimization Technique for Integrated Low-Noise Amplifiers, 37 IEEE Journal of Solid-State Circuits, 994 (2002).

Taris, et al., Current Reuse CMOS LNA for UWB Applications, IEEE Eur. Solid-State Circuits Conference, 294 (2008).

Nam, et al., CMOS RF Amplifier and Mixer Circuits Utilizing Complementary Characteristics of Parallel Combined NMOS and PMOS devices, 53 IEEE Transactions on Microwave Theory and Techniques, 1662 (2005).

Lee, et al., A 3 GHz Subthreshold CMOS Low Noise Amplifier, IEEE Radio Frequency Integrated Circuits Symposium, (2006).

Shameli, et al., A Novel Ultra-Low Power (ULP) Low Noise Amplifier Using Differential Inductor Feedback, IEEE Eur. Solid-State Circuits Conference, 352 (2006).

Sun, et al., CMOS RF Biosensor Utilizing Nuclear Magnetic Resonance, 44 IEEE Journal of Solid-State Circuits 1629 (2009).

In re Investigation of the Spectrum Requirements for Advanced Medical Technologies, F.C.C. 09-23-A1, (Mar. 20, 2009).

MICS Band Plan, 47 C.F.R. § 95 (2013).

Langevelde, et al., An Ultra-Low-Power 868/915 MHz RF Transceiver for Wireless Sensor Network Applications, IEEE Radio Frequency Integrated Circuits Symposium, 113 (2009).

Perumana, et al., A Low-Power Fully Monolithic Subthreshold CMOS Receiver with Integrated LO Generation for 2.4 GHz Wireless PAN Applications, 43 IEEE Journal of Solid-State Circuits, 2229 (2008).

Feng, et al., Design of a High Performance 2-GHz Direct-Conversion Front-End with a Single-Ended RF Input in 0.13um CMOS, 44 IEEE Journal of Solid-State Circuits, 1380 (2009).

Camus, et al., a 5.4mW 0.07mm2 2.4 GHz Front-End Receiver in 90 nm CMOS for IEEE 802.15.4 WPAN, 43 IEEE Journal of Solid-State Circuits, 1372 (2008).

\* cited by examiner

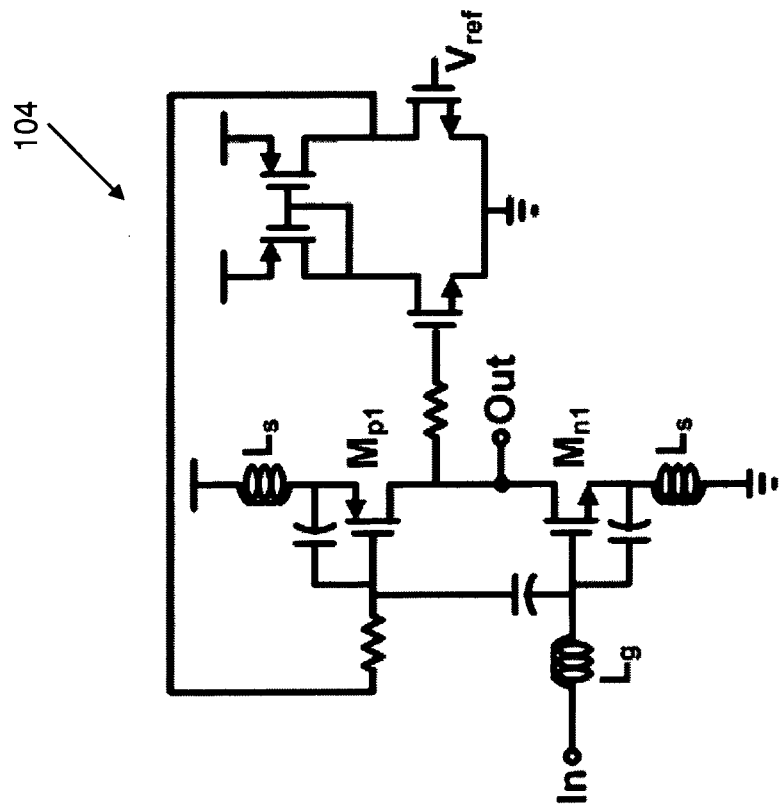
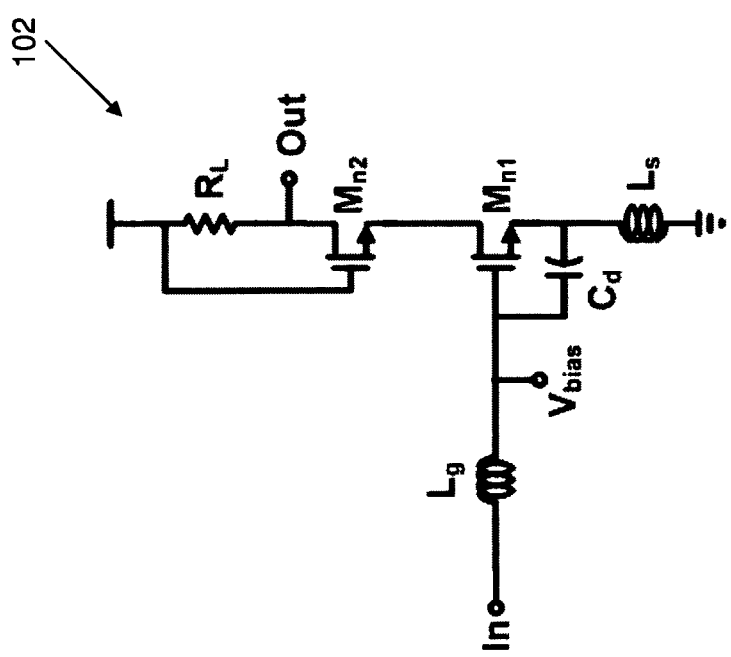
Figure 1b
Figure 1a

| Parameter | Target | Conventional | Proposed |
|---|---|---|---|
| Frequency | 401-406 MHz | 401-406 MHz | 401-406 MHz |
| Gain | 19 dB | 19 dB | 19 dB |
| S11 | <-10 dB | -14 dB | -16 dB |
| NF | 5 dB | 2.6 dB | 1.8 dB |
| IIP3 | -13 dBm | -10.7 dBm | -6.5 dBm |
| Power | 150uW @ 1V | 151uW @ 1V | 151uW @ 1V |
| Technology | 0.18um CMOS | 0.18um CMOS | 0.18um CMOS |

Figure 11

| Parameter | [2]JSSC08 | [3]RFIC06 | [4]TMTT08 | [5]ESSCIRC06 | Preliminary measurements (50ohm impedance matching) | Simulated (high impedance matching) |
|---|---|---|---|---|---|---|
| Frequency | 862-870 MHz 902-928 MHz | 3 GHz | 2.4 GHz | 1 GHz | 401-406 MHz | 401-406 MHz |
| Topology | Cascode | Cascode | Cascode | CS+FB | Complementary CS | Complementary CS |
| Gain | 20 dB | 4.5 dB (power) | 21.4 dB | 16.8 dB | 20.2 dB | 22 dB |
| NF | 5 dB | 6.3 dB | 5.2 dB | 3.9 dB | 2.9 dB | 1.5 dB |
| IIP3 | P1dB: -18 dBm | -10.5 dBm | -11 dBm | -11.2 dBm | -8.1 dBm | -13 dBm |
| Power | 200uW @ 1V | 160uW @ 0.6V | 1.1mW @ 1.8V | 100uW @ 1V | 150uW @ 1V | 100uW @ 1V |
| Technology | 0.13um CMOS | 0.13um CMOS | 0.18um CMOS | 0.18um CMOS | 0.18um CMOS | 0.18um CMOS |
| F.O.M.[2] | 16.2 (Assume IIP3: -8 dBm) | 12.5 | 3.6 | 21.6 | 20 | 22.6 |

- ft is assumed 60 GHz(0.18um), 80 GHz(0.13um), 100 GHz (90nm)

$$FOM = 10\log(100 \cdot \frac{Gain[dB]}{(F-1) \cdot P_{dc}[mW]} \cdot \frac{IIP3[mW]}{P_{dc}[mW]}) + 10\log(\frac{f_o}{f_t})$$

Figure 14

| Parameter | [6] | [7] | [8] | [9] | This work |
|---|---|---|---|---|---|
| Frequency [GHz] | 0.868/ 0.915 | 2.4 | 2 | 2.4 | 0.401-0.406 |
| Gain [dB] | 32 | 43 | 30 | 37 | 28.7 |
| NF [dB] | 10 | 5 | 3.1 | 6 | 5.5 |
| IIP3 [dBm] | -22 | -37 | -12 | -12 | -25 |
| Power [mW] | 1.08@ 1.2V | 1.4@ 1.2V | 12@ 1.5V | 5.4@ 1.35V | 0.49@ 1V |
| Technology | 0.13um CMOS | 0.18um CMOS | 0.13um CMOS | 90nm CMOS | 0.18um CMOS |
| F.O.M.* | -16.6 | -20.7 | -15 | -11.9 | -9.9 |

Figure 22

AMPLIFIER AND TRANSCEIVER INCLUDING THE AMPLIFIER

TECHNICAL FIELD

Various embodiments relate generally to an amplifier and a transceiver including the amplifier.

BACKGROUND

In March 2009, the Federal Communications Commission (FCC) introduced the Medical Device Radiocommunications Service (MedRadio) band in the range of 401-406 MHz which is a wireless communication regulation dedicated for biomedical telemetry. Formerly known as the 402-405 MHz Medical Implant Communication Service (MICS) band allocated in 1999, MedRadio is the superset of MICS in which additional adjacent bands at 401-402 MHz and 405-406 MHz are newly designated with twenty 100 kHz bandwidth channels to provide a total of five megahertz of contiguous spectrum and accommodate both implantable and wearable sensor devices for medical use.

Due to the need for reliable, continuous, and cost-effective health monitoring in hospitals and homes in recent years, both implantable and wearable sensors in Wireless Body Area Networks (WBAN) must meet ultra-low-power consumption for prolonged battery life. Since the wireless part of the sensor device usually consumes the most power, it is important to reduce both the current and the supply voltage of the transceiver to minimize the power consumption without compromising the performance.

Among several wireless bands for wearable sensor applications such as the industrial, scientific, and medical (ISM) frequencies at 433 MHz, 868-928 MHz, and 2.4 GHz respectively, some of these bands are not recognized globally while higher frequencies have the disadvantage of increased power consumption and free-space path loss. As higher frequencies are utilized for many other non-medical applications, it is prone to interference issues which are critical in biomedical applications where highly reliable communication is of key importance.

A low noise amplifier (LNA) usually dominates the total noise performance and sensitivity of a receiver used in biomedical applications. However, conventional LNAs typically have a limitation in performance improvement without increasing power, complexity or area.

FIG. 1a shows a conventional source degeneration cascode LNA (SDCLNA) 102. The SDCLNA 102 has a simple topology and can achieve a good noise performance with sufficient gain even at low bias current due to the passive amplification from the input matching circuitry. However, in order to constrain the current consumption of the SDCLNA 102 to less than 150 μA, the transistor $M_{n1}$ is biased close to threshold and its size is limited which leads to a small transconductance $g_m$ and a small gate-to-source capacitance $C_{gs}$. A small $g_m$ and $C_{gs}$ will require large values of depletion capacitance $C_d$, gate inductance $L_g$, and source inductance $L_s$ in order to match the impedance to 50Ω at 400 MHz. Thus, at a low frequency of operation (e.g. <1 GHz) and low power (<~mW), large sizes of passive matching components (e.g. source inductor) are required for 50Ω matching. A small $g_m$ also leads to a limitation in the gain and noise performance. Thus, there is a limitation of performance improvement (noise and linearity) without power increase. It is difficult to further improve the noise figure (NF) of the SDCLNA 102 without increasing the power consumption.

FIG. 1b shows a conventional current-reuse LNA 104. The current-reuse LNA 104 has a current reuse topology and can provide an improved noise performance. However, the current-reuse LNA 104 requires additional DC feedback circuitry and additional passive components for performance improvement.

SUMMARY

According to one embodiment, an amplifier is provided. The amplifier includes an input terminal; a first transistor of a first conductivity and a second transistor of a second conductivity, each transistor comprising a source terminal, a gate terminal and a drain terminal respectively, the source terminal of the first transistor being coupled to the source terminal of the second transistor, and the gate terminal of the first transistor and the gate terminal of the second transistor being coupled to the input terminal; and an output terminal coupled to the drain terminal of the first transistor and the drain terminal of the second transistor is provided.

In one embodiment, the amplifier may further include a first depletion capacitor coupled between the gate terminal and the source terminal of the first transistor.

In one embodiment, the first depletion capacitor may include a positive terminal and a negative terminal. The positive terminal of the first depletion capacitor may be coupled to the gate terminal of the first transistor and the negative terminal of the first depletion capacitor may be coupled to the source terminal of the first transistor.

In one embodiment, the amplifier may further include a second depletion capacitor coupled between the gate terminal and the source terminal of the second transistor.

In one embodiment, the second depletion capacitor may include a positive terminal and a negative terminal. The positive terminal of the second depletion capacitor may be coupled to the gate terminal of the second transistor and the negative terminal of the second depletion capacitor may be coupled to the source terminal of the second transistor.

In one embodiment, the amplifier may further include a first resistor coupled between the drain terminal of the first transistor and a first voltage reference point.

In one embodiment, the first resistor may include a first terminal and a second terminal. The first terminal of the first resistor may be coupled to the drain terminal of the first transistor and the second terminal of the first resistor may be coupled to the first voltage reference point.

In one embodiment, the amplifier may further include a second resistor coupled between the drain terminal of the second transistor and a second voltage reference point.

In one embodiment, the second resistor may include a first terminal and a second terminal. The first terminal of the second resistor may be coupled to the drain terminal of the second transistor and the second terminal of the second resistor may be coupled to the second voltage reference point.

In one embodiment, the amplifier may further include a first output capacitor coupled between the drain terminal of the first transistor and the output terminal.

In one embodiment, the first output capacitor may include a positive terminal and a negative terminal. The positive terminal of the first output capacitor may be coupled to the drain terminal of the first transistor and the first terminal of the first resistor and the negative terminal of the first output capacitor may be coupled to the output terminal.

In one embodiment, the amplifier may further include a second output capacitor coupled between the drain terminal of the second transistor and the output terminal.

In one embodiment, the second output capacitor may include a positive terminal and a negative terminal. The positive terminal of the second output capacitor may be coupled to the drain terminal of the second transistor and the first terminal of the second resistor and the negative terminal of the second output capacitor may be coupled to the output terminal.

In one embodiment, the amplifier may further include a gate inductor having a first terminal and a second terminal, a first gate capacitor having a positive terminal and a negative terminal, and a second gate capacitor having a positive terminal and a negative terminal. The first terminal of the gate inductor may be coupled to the input terminal, and the second terminal of the gate inductor may be coupled to the positive terminal of the first gate capacitor and the positive terminal of the second gate capacitor. The negative terminal of the first gate capacitor may be coupled to the gate terminal of the first transistor and the positive terminal of the first depletion capacitor. The negative terminal of the second gate capacitor may be coupled to the gate terminal of the second transistor and the positive terminal of the second depletion capacitor.

In one embodiment, the amplifier may further include a source inductor having a first terminal and a second terminal, and a source capacitor having a positive terminal and a negative terminal. The first terminal of the source inductor may be coupled to the source terminal of the first transistor, the negative terminal of the first depletion capacitor, the source terminal of the second transistor and the negative terminal of the second depletion capacitor. The second terminal of the source inductor may be coupled to the positive terminal of the source capacitor. The negative terminal of the source capacitor may be coupled to the second voltage reference point.

In one embodiment, the amplifier may further include a first bias voltage input terminal adapted to provide a first bias voltage to the gate terminal of the first transistor.

In one embodiment, the first bias voltage input terminal may be provided between the negative terminal of the first gate capacitor and the positive terminal of the first depletion capacitor.

In one embodiment, the amplifier may further include a second bias voltage input terminal adapted to provide a second bias voltage to the gate terminal of the second transistor.

In one embodiment, the second bias voltage input terminal may be provided between the negative terminal of the second gate capacitor and the positive terminal of the second depletion capacitor.

In one embodiment, the first transistor may include an n-channel metal-oxide-semiconductor field-effect transistor.

In one embodiment, the second transistor may include a p-channel metal-oxide-semiconductor field-effect transistor.

In one embodiment, the second voltage reference point may be ground.

According to another embodiment, a transceiver including an amplifier as described above is provided.

According to yet another embodiment, an amplifier is provided. The amplifier includes an input terminal and an output terminal, wherein the input terminal and the output terminal are single-ended with equal phases for a signal; and a core configured to operate as a differential mode.

In one embodiment, the core may include a first transistor of a first conductivity and a second transistor of a second conductivity, each transistor comprising a source terminal, a gate terminal and a drain terminal respectively, the source terminal of the first transistor being coupled to the source terminal of the second transistor, and the gate terminal of the first transistor and the gate terminal of the second transistor being coupled to the input terminal.

In one embodiment, the first transistor may include an n-channel metal-oxide-semiconductor field-effect transistor.

In one embodiment, the second transistor may include a p-channel metal-oxide-semiconductor field-effect transistor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1a shows a schematic diagram of a conventional source degeneration cascode low noise amplifier (SDCLNA).

FIG. 1b shows a schematic diagram of a conventional current-reuse low noise amplifier.

FIG. 11 shows a table listing simulation results of a conventional source degeneration cascode low noise amplifier (SDCLNA) and simulation results of an amplifier according to one embodiment.

FIG. 14 shows a table listing simulation results of four conventional amplifiers, preliminary measurements of an amplifier with 50Ω impedance matching according to one embodiment, and simulation results of an amplifier with high impedance matching (non-50Ω matching) according to one embodiment.

FIG. 22 shows a table showing measured results of four conventional receivers and measured results of a receiver RF front-end according to one embodiment.

DETAILED DESCRIPTION

Embodiments of an amplifier and a transceiver including the amplifier will be described in detail below with reference to the accompanying figures. It will be appreciated that the embodiments described below can be modified in various aspects without changing the essence of the invention.

Figure 2:
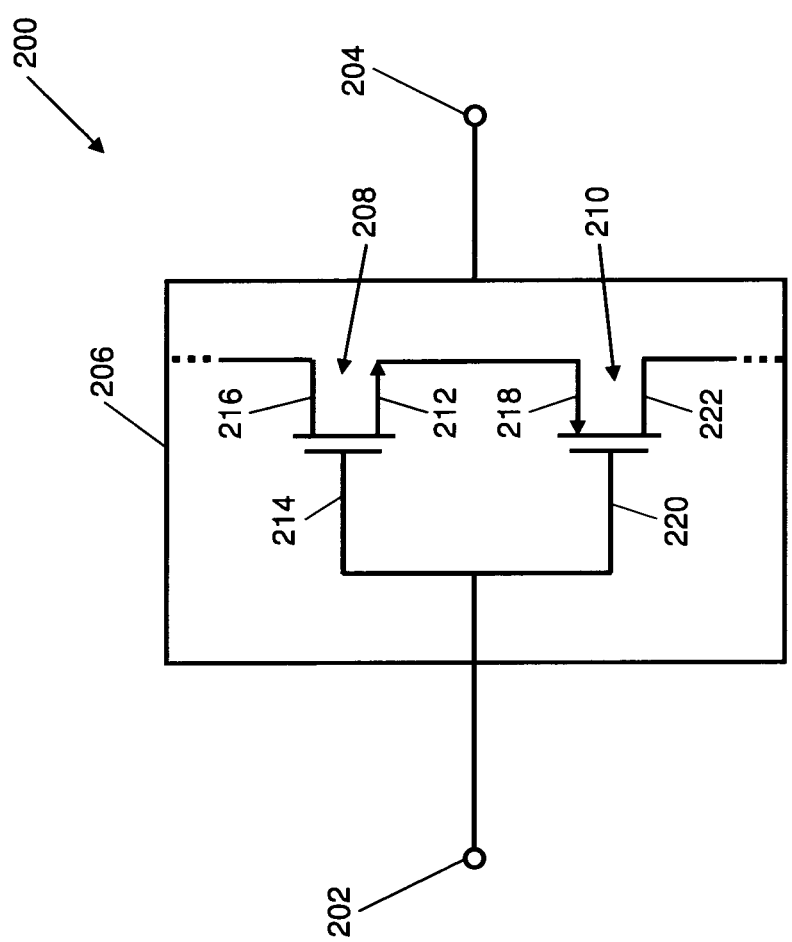
FIG. 2 shows a schematic diagram of an amplifier according to one embodiment.

FIG. 2 shows a schematic diagram of one embodiment of an amplifier 200. The amplifier 200 includes an input terminal 202 and an output terminal 204. The input terminal 202 and the output terminal 204 are single-ended with equal phases for a signal. The amplifier 200 also includes a core 206.

The core 206 includes a first transistor 208 of a first conductivity and a second transistor 210 of a second conductivity. In one embodiment, the first transistor 208 may be an n-channel metal-oxide-semiconductor field-effect transistor (NMOS), and the second transistor 210 may be a p-channel metal-oxide-semiconductor field-effect transistor (PMOS). The first transistor 208 has a source terminal 212, a gate terminal 214 and a drain terminal 216. The second transistor 210 has a source terminal 218, a gate terminal 220 and a drain terminal 222.

In one embodiment, the source terminal 212 of the first transistor 208 is coupled to the source terminal 218 of the second transistor 210. The gate terminal 214 of the first transistor 208 and the gate terminal 220 of the second transistor 210 are coupled to the input terminal 202. The drain terminal 216 of the first transistor 208 and the drain terminal 222 of the second transistor 210 may be coupled to various electrical components which are not shown for ease of illustration. Details of the coupling of the drain terminal 216 of the first transistor 208 and the drain terminal 222 of the second transistor 210 are shown in FIG. 3 and are described in detail with respect to FIG. 3.

The core 206 is configured to operate as a differential mode. The core 206 may operate as a differential mode due to the complementary characteristic of the first transistor 208 and the second transistor 210. Since the first transistor 208 is NMOS and the second transistor 210 is PMOS, the core 206 can operate between a high (e.g. positive) voltage and a low (e.g. negative) voltage. When a high (e.g. positive) voltage is applied at the input terminal 202, the first transistor 208 is on (i.e. operating) and the second transistor 210 is off. When a low (e.g. negative voltage) is applied at the input terminal 202, the first transistor 208 is off and the second transistor 210 is on (i.e. operating).

Figure 3:
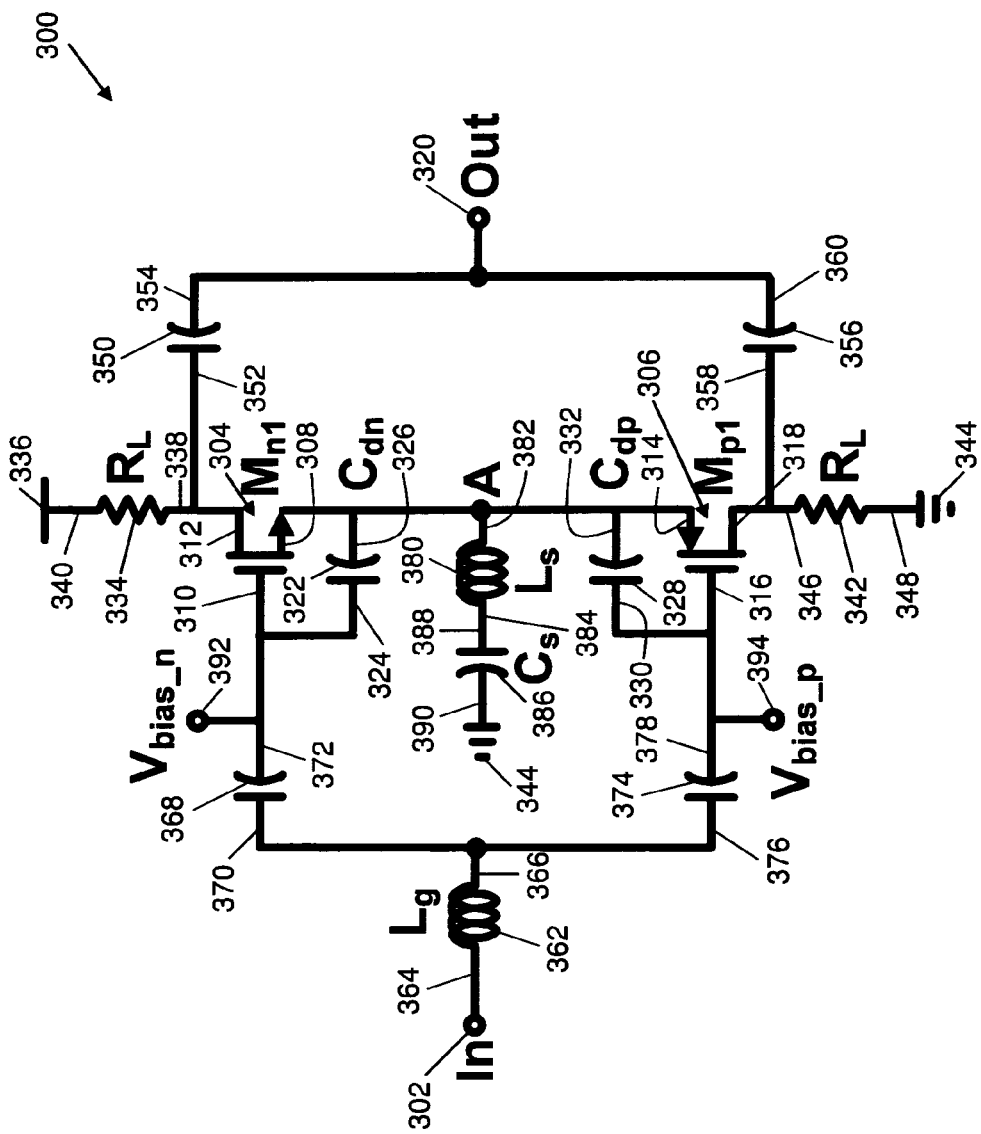
FIG. 3 shows a schematic diagram of an amplifier according to one embodiment.

FIG. 3 shows a schematic diagram of another embodiment of an amplifier 300. The amplifier 300 includes an input terminal 302, a first transistor 304 of a first conductivity and a second transistor 306 of a second conductivity. In one embodiment, the first transistor 304 may be an n-channel metal-oxide-semiconductor field-effect transistor (NMOS), and the second transistor 306 may be a p-channel metal-oxide-semiconductor field-effect transistor (PMOS).

The first transistor 304 includes a source terminal 308, a gate terminal 310 and a drain terminal 312. The second transistor 306 includes a source terminal 314, a gate terminal 316 and a drain terminal 318. In one embodiment, the source terminal 308 of the first transistor 304 is coupled to the source terminal 314 of the second transistor 306. The gate terminal 310 of the first transistor 304 and the gate terminal 316 of the second transistor 306 are coupled to the input terminal 302.

The amplifier 300 includes an output terminal 320 coupled to the drain terminal 312 of the first transistor 304 and the drain terminal 318 of the second transistor 306. The amplifier 300 also includes a first depletion capacitor 322 coupled between the gate terminal 310 and the source terminal 308 of the first transistor 304. The first depletion capacitor 322 has a positive terminal 324 and a negative terminal 326. The positive terminal 324 of the first depletion capacitor 322 is coupled to the gate terminal 310 of the first transistor 304 and the negative terminal 326 of the first depletion capacitor 322 is coupled to the source terminal 308 of the first transistor 304.

The amplifier 300 includes a second depletion capacitor 328 coupled between the gate terminal 316 and the source terminal 314 of the second transistor 306. The second depletion capacitor 328 has a positive terminal 330 and a negative terminal 332. The positive terminal 330 of the second depletion capacitor 328 is coupled to the gate terminal 316 of the second transistor 306 and the negative terminal 332 of the second depletion capacitor 328 is coupled to the source terminal 314 of the second transistor 306.

The amplifier 300 includes a first resistor 334 coupled between the drain terminal 312 of the first transistor 304 and a first voltage reference point 336. The first resistor 334 includes a first terminal 338 and a second terminal 340. The first terminal 338 of the first resistor 334 is coupled to the drain terminal 312 of the first transistor 304 and the second terminal 340 of the first resistor 334 is coupled to the first voltage reference point 336.

The amplifier 300 includes a second resistor 342 coupled between the drain terminal 318 of the second transistor 306 and a second voltage reference point 344. The second resistor has a first terminal 346 and a second terminal 348. The first terminal 346 of the second resistor 342 is coupled to the drain terminal 318 of the second transistor 306 and the second terminal 348 of the second resistor 342 is coupled to the second voltage reference point 344. In one embodiment, the second voltage reference point 344 may be ground.

The amplifier 300 includes a first output capacitor 350 coupled between the drain terminal 312 of the first transistor 308 and the output terminal 320. The first output capacitor 350 has a positive terminal 352 and a negative terminal 354. The positive terminal 352 of the first output capacitor 350 is coupled to the drain terminal 312 of the first transistor 304 and the first terminal 338 of the first resistor 334. The negative terminal 354 of the first output capacitor 350 is coupled to the output terminal 320.

The amplifier 300 includes a second output capacitor 356 coupled between the drain terminal 318 of the second transistor 306 and the output terminal 320. The second output capacitor 356 has a positive terminal 358 and a negative terminal 360. The positive terminal 358 of the second output capacitor 356 is coupled to the drain terminal 318 of the second transistor 306 and the first terminal 346 of the second resistor 342. The negative terminal 360 of the second output capacitor 356 is coupled to the output terminal 320.

In other words, the negative terminal 354 of the first output capacitor 350 is coupled to the negative terminal 360 of the second output capacitor 356. The output terminal 320 is coupled between the negative terminal 354 of the first output capacitor 350 and the negative terminal 360 of the second output capacitor 356.

The amplifier 300 includes a gate inductor 362 having a first terminal 364 and a second terminal 366, a first gate capacitor 368 having a positive terminal 370 and a negative terminal 372, and a second gate capacitor 374 having a positive terminal 376 and a negative terminal 378. The first terminal 364 of the gate inductor 362 is coupled to the input terminal 302, and the second terminal 366 of the gate inductor 362 is coupled to the positive terminal 370 of the first gate capacitor 368 and the positive terminal 376 of the second gate capacitor 374. The negative terminal 372 of the first gate capacitor 368 is coupled to the gate terminal 310 of the first transistor 304 and the positive terminal 324 of the first depletion capacitor 322. The negative terminal 378 of the second gate capacitor 374 is coupled to the gate terminal 316 of the second transistor 306 and the positive terminal 330 of the second depletion capacitor 328.

The amplifier 300 also includes a source inductor 380 having a first terminal 382 and a second terminal 384, and a source capacitor 386 having a positive terminal 388 and a negative terminal 390. The first terminal 382 of the source inductor 380 is coupled to the source terminal 308 of the first transistor 304, the negative terminal 326 of the first depletion capacitor 322, the source terminal 314 of the second transistor 306 and the negative terminal 332 of the second depletion capacitor 328. The second terminal 384 of the source inductor 380 is coupled to the positive terminal 388 of the source capacitor 386. The negative terminal 390 of the source capacitor 386 is coupled to the second voltage reference point 344.

The amplifier 300 includes a first bias voltage input terminal 392 adapted to provide a first bias voltage to the gate terminal 310 of the first transistor 304. The first bias voltage input terminal 392 is provided between the negative terminal 372 of the first gate capacitor 368 and the positive terminal 324 of the first depletion capacitor 322. The amplifier 300 also includes a second bias voltage input terminal 394 adapted to provide a second bias voltage to the gate terminal 316 of the second transistor 306. The second bias voltage input terminal 394 is provided between the negative terminal 378 of the second gate capacitor 374 and the positive terminal 330 of the second depletion capacitor 328.

In one embodiment, the amplifier 300 may include an n-channel metal-oxide-semiconductor field-effect transistor (NMOS) and a p-channel metal-oxide-semiconductor field-effect transistor (PMOS). The NMOS and the PMOS may be coupled such that the respective source terminals are coupled together. Thus, the amplifier 300 may have a common source topology. The respective gate terminals of the NMOS and the PMOS may be coupled together. An input terminal may be coupled between the gate terminals of the NMOS and the PMOS. The respective drain terminals of the NMOS and the PMOS may be coupled together. An output terminal may be coupled between the drain terminals of the NMOS and the PMOS. In other words, the amplifier 300 may provide a single input and a single output. The arrangement of the NMOS and the PMOS may provide a complementary metal-oxide-semiconductor field-effect transistor (CMOS). With this arrangement, the NMOS and the PMOS may be on (i.e. operating) depending on the input. When the input is high, the NMOS is on and the PMOS is off. When the input is low, the NMOS is off and the PMOS is on.

Figure 4:
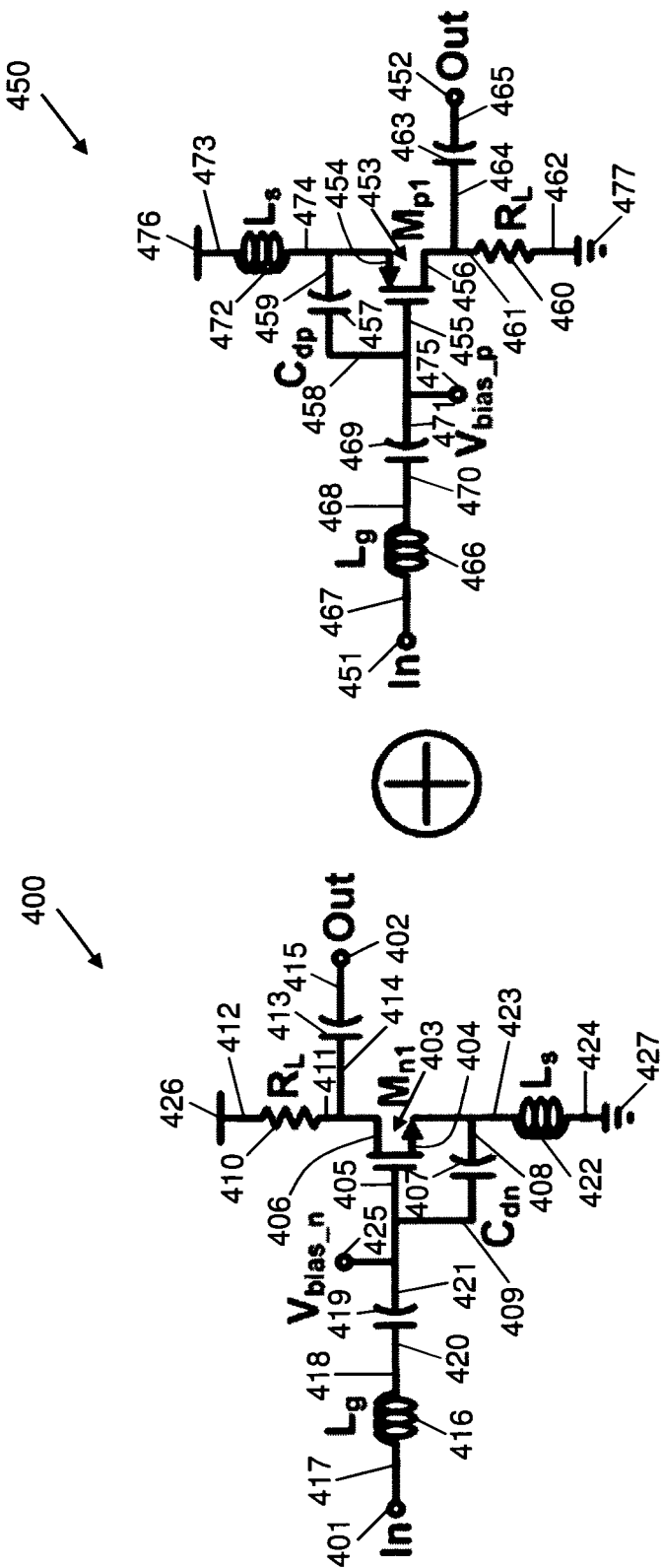
FIG. 4 shows schematic diagrams of a first circuit arrangement and a second circuit arrangement according to one embodiment.

In one embodiment, the amplifier 300 may be formed by combining a first circuit arrangement 400 and a second circuit arrangement 450 as shown in FIG. 4. The first circuit arrangement 400 includes an input terminal 401 and an output terminal 402. The first circuit arrangement 400 includes a transistor 403 of a first conductivity having a source terminal 404, a gate terminal 405 and a drain terminal 406, a depletion capacitor 407 having a positive terminal 408 and a negative terminal 409, a resistor 410 having a first terminal 411 and a second terminal 412, an output capacitor 413 having a positive terminal 414 and a negative terminal 415, a gate inductor 416 having a first terminal 417 and a second terminal 418, a gate capacitor 419 having a positive terminal 420 and a negative terminal 421, and a source inductor 422 having a first terminal 423 and a second terminal 424. In one embodiment, the transistor 403 may be an n-channel metal-oxide-semiconductor field-effect transistor (NMOS). The first circuit arrangement 400 also includes a bias voltage input terminal 425.

The source terminal 404 of the transistor 403 is coupled to the negative terminal 408 of the depletion capacitor 407 and the first terminal 423 of the source inductor 422. The gate terminal 405 of the transistor 403 is coupled to the positive terminal 409 of the depletion capacitor 407 and the negative terminal 421 of the gate capacitor 419. The drain terminal 406 of the transistor 403 is coupled to the first terminal 411 of the resistor 410 and the positive terminal 414 of the output capacitor 413.

The positive terminal 420 of the gate capacitor 419 is coupled to the second terminal 418 of the gate inductor 416. The first terminal 417 of the gate inductor 416 is coupled to the input terminal 401. The negative terminal 415 of the output capacitor 413 is coupled to the output terminal 402. The second terminal 412 of the resistor 410 is coupled to a first voltage reference point 426. The second terminal 424 of the source inductor 422 is coupled to a second voltage reference point 427. In one embodiment, the second voltage reference point 427 may be ground. The bias voltage input terminal 425 is coupled between the negative terminal 421 of the gate capacitor 419 and the positive terminal 409 of the depletion capacitor 407. The bias voltage input terminal 425 may be adapted to provide a bias voltage to the gate terminal 405 of the transistor 403.

The second circuit arrangement 450 includes an input terminal 451 and an output terminal 452. The second circuit arrangement 450 includes a transistor 453 of a second conductivity having a source terminal 454, a gate terminal 455 and a drain terminal 456, a depletion capacitor 457 having a positive terminal 458 and a negative terminal 459, a resistor 460 having a first terminal 461 and a second terminal 462, an output capacitor 463 having a positive terminal 464 and a negative terminal 462, a gate inductor 466 having a first terminal 467 and a second terminal 468, a gate capacitor 469 having a positive terminal 470 and a negative terminal 471, and a source inductor 472 having a first terminal 473 and a second terminal 474. In one embodiment, the transistor 453 may be a p-channel metal-oxide-semiconductor field-effect transistor (PMOS). The second circuit arrangement 450 also includes a bias voltage input terminal 475.

The source terminal 454 of the transistor 453 is coupled to the negative terminal 459 of the depletion capacitor 457 and the second terminal 474 of the source inductor 472. The gate terminal 455 of the transistor 453 is coupled to the positive terminal 458 of the depletion capacitor 457 and the negative terminal 471 of the gate capacitor 469. The drain terminal 456 of the transistor 453 is coupled to the first terminal 461 of the resistor 460 and the positive terminal 464 of the output capacitor 463.

The positive terminal 470 of the gate capacitor 469 is coupled to the second terminal 468 of the gate inductor 466. The first terminal 467 of the gate inductor 466 is coupled to the input terminal 451. The negative terminal 462 of the output capacitor 463 is coupled to the output terminal 452. The first terminal 473 of the source inductor 472 is coupled to a third voltage reference point 476. The second terminal 462 of the resistor 460 is coupled to a fourth voltage reference point 477. In one embodiment, the fourth voltage reference point 477 may be ground. The bias voltage input terminal 475 is coupled between the negative terminal 471 of the gate capacitor 469 and the positive terminal 458 of the depletion capacitor 457. The bias voltage input terminal 475 may be adapted to provide a bias voltage to the gate terminal 455 of the transistor 453.

The first circuit arrangement 400 and the second circuit arrangement 450 may be combined to form the amplifier 300 by stacking the transistor 403 of the first circuit arrangement 400 on top of the transistor 453 of the second circuit arrangement 450.

In one embodiment, the amplifier 300 may be a complementary current-reuse amplifier. The amplifier 300 may have a complementary current-reuse common-source (CS) topology where a NMOS CS amplifier (e.g. first transistor 304) is stacked on top of a PMOS CS amplifier (e.g. second transistor 306) to reuse the direct current (DC) among the two symmetrically stacked amplifiers. In short, the DC current can flow through both the NMOS CS amplifier (e.g. first transistor 304) and the PMOS CS amplifier (e.g. second transistor 306), i.e. through the drain terminal 312 of the first transistor 304 and the drain terminal 318 of the second transistor 306. The advantage of having this configuration in comparison to a conventional current-reuse topology is that no DC feedback circuitry is required to define the operating point of high impedance output node. No additional circuit or complexity is required. Less number of passive components is required for input matching. The common-source (CS) topology can provide improved noise and linearity performance.

Since only a small amount of DC current flows through the drain terminals 312, 318 of the transistors 304, 306, a small voltage drop occurs in both load resistors $R_L$ (e.g. first and second resistors 334, 342) and 1-V supply voltage can still be used without headroom issues. In other words, a low voltage and ultra-low power design can be used for the amplifier 300. No additional power is required for the common-source (CS) topology of the amplifier 300. Both the first transistor $M_{n1}$ 304 and the second transistor $M_{p1}$ 306 are biased so that the gate-to-source voltage $V_{GS}$ is close to the threshold voltage $V_{th}$. The transistors 304, 306 are sized so that the voltage at node A is biased at $V_{DD}/2$ (supply voltage/2) to provide symmetric characteristics between the two stacked amplifiers. Node A is alternating current (ac) ground at 400 MHz due to the large bypass capacitor $C_s$ (e.g. source capacitor 386). The large bypass capacitor $C_s$ (e.g. source capacitor 386) is included for ac ground and stability. The source degeneration on-chip spiral inductor $L_s$ (e.g. source inductor 380) is used for input impedance matching along with the depletion capacitors $C_d$ 322, 328 and the gate inductor $L_g$ 362. Since both the transconductance $g_m$ and gate-to-source capacitance $C_{gs}$ are increased in comparison to the SDCLNA 102 of FIG. 1 at the same power consumption, the size of both the depletion capacitors $C_d$ 322, 328 and the source inductor $L_s$ 380 can be reduced, resulting in a smaller die area. The ac-coupled gate terminals 310, 316 and drain terminals 312, 318 of the first transistor $M_{n1}$ 304 and the second transistor $M_{p1}$ 306 are connected together, respectively, which results in both the input and output of the resulting amplifier 300 being single-ended with equal phases for the signal. The amplifier 300 operates as a differential mode due to the complementary characteristic of NMOS (e.g. the first transistor 304) and PMOS (e.g. the second transistor 306). This may result in a single-ended input-output differential amplifier 300.

Figure 5:
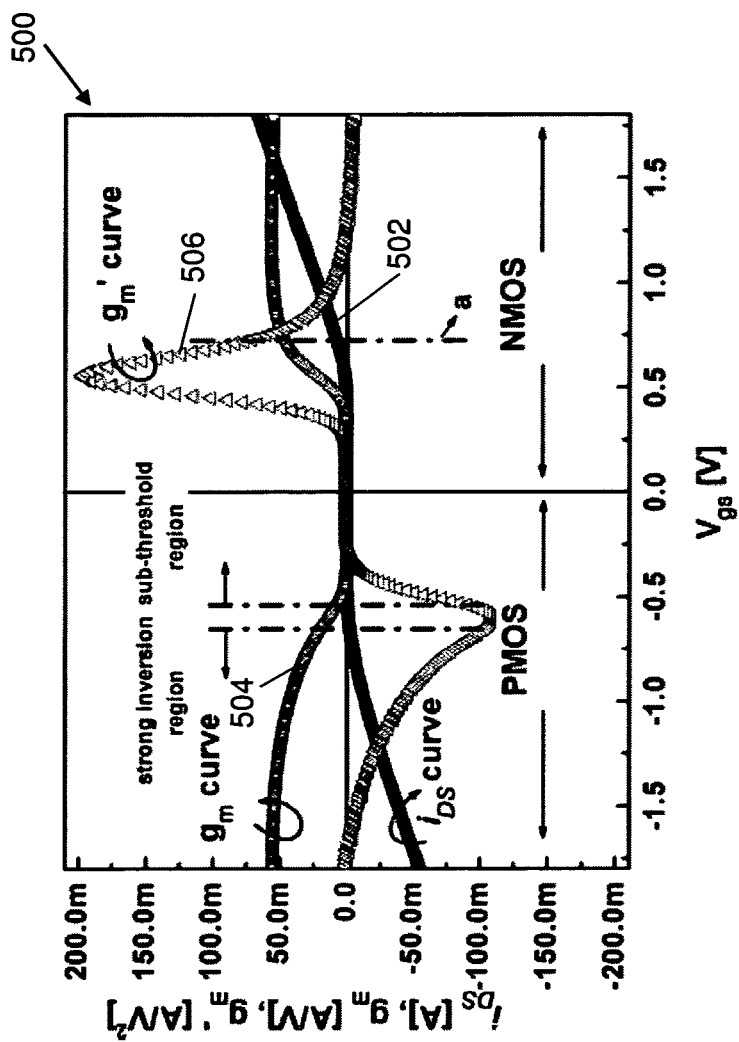
FIG. 5 shows a graph of measured drain current $i_{DS}$, transconductance $g_m$, and first derivative of transconductance $g_m'$ of a 120-μm/0.18-μm n-channel metal-oxide-semiconductor field-effect transistor and a 240-μm/0.18-μm p-channel metal-oxide-semiconductor field-effect transistor.

Since the amplifier 300 effectively operates as a differential amplifier, the even-order distortion can be eliminated. FIG. 5 shows a graph 500 of measured drain current $i_{DS}$, transconductance $g_m$, and first derivative of transconductance $g_m'$ of a 120-μm/0.18-μm NMOS and a 240-μm/0.18-μm PMOS FET (see reference [1] I. Nam, B. Kim, and K. Lee, "CMOS RF amplifier and mixer circuits utilizing complementary characteristics of parallel combined NMOS and PMOS devices," IEEE Trans. Microw. Theory and Tech., vol. 53, no. 5, pp. 1662-1671, May 2005). Plot 502 shows the measured total drain current $i_{DS}$ plotted against a gate-to-source voltage $V_{gs}$. Plot 504 shows the transconductance $g_m$ plotted against the gate-to-source voltage $V_{gs}$. Plot 506 shows the first derivative of transconductance $g_m$ plotted against the gate-to-source voltage $V_{gs}$. Plot 506 shows that $g_m'$ of NMOS and $g_m'$ of PMOS have opposite signs.

A small signal drain current $i_{ds}$ of a common source metal-oxide semiconductor field effect transistor (e.g. the first transistor 304 and the second transistor 306) can be expressed:

$$i_{ds} = I_{DS} + g_m v_{gs} + \frac{1}{2!} g_m' v_{gs}^2 + \frac{1}{2!} g_m'' v_{gs}^3 + \dots$$

wherein $i_{ds}$ is small signal drain current of the transistor, $I_{DS}$ is direct current (DC) drain current of the transistor, $g_m$ is the transconductance, $g_m'$ is the first derivative of the transconductance $g_m$, and $v_{gs}$ is small signal gate-to-source voltage.

From the above equation, it can be understood by a skilled person that $g_m'$ causes second-order nonlinearity of the drain current. Since $g_m'$ of NMOS (e.g. the first transistor 304) and $g_m'$ of PMOS (e.g. the second transistor 306) have opposite signs, combining them can suppress the second-order nonlinearity of the drain current. A slight improvement in third-order nonlinearity can be obtained due to cancelling effect of $g_m'$. In other words, an improvement in the second order input intercept point IIP2 performance can lead to a slight enhancement in the third order input intercept point IIP3.

Figure 6:
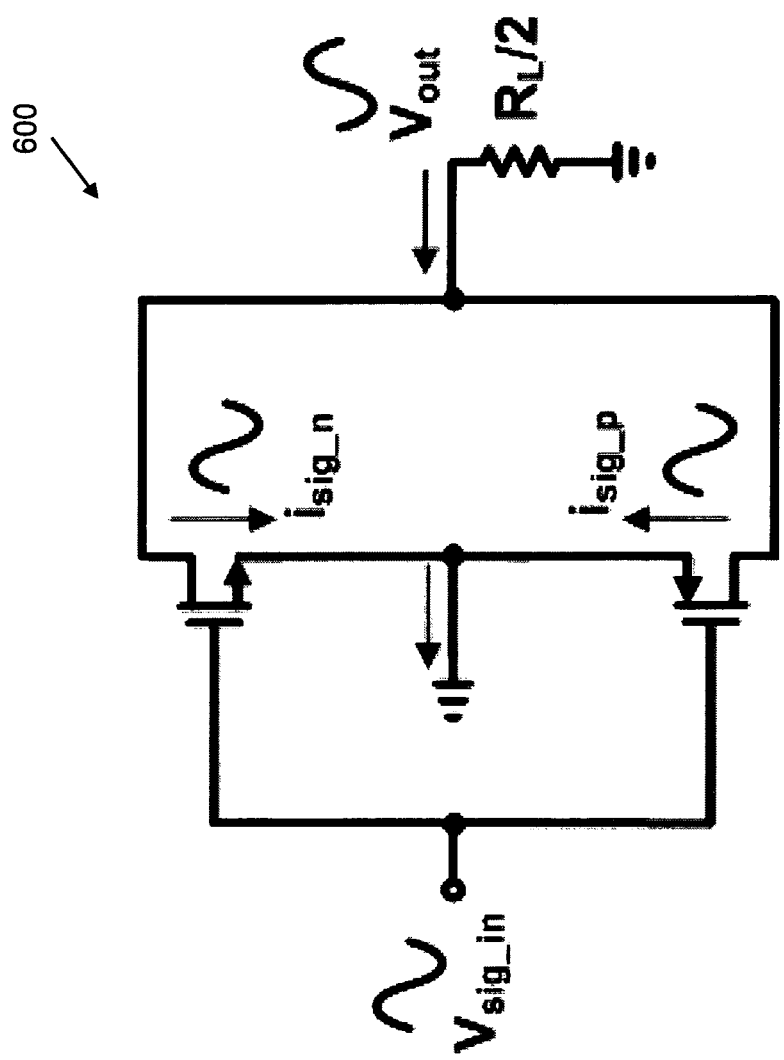
FIG. 6 shows a schematic diagram of an alternating current equivalent circuit of an amplifier according to one embodiment.

FIG. 6 shows a schematic diagram of an AC (alternating current) equivalent circuit 600 of the amplifier 300. $V_{sig\_in}$ represents an input voltage of the circuit 600, $i_{sig\_n}$ represents a current passing through the first transistor 304, $i_{sig\_p}$ represents a current passing through the second transistor 306, and $V_{out}$ represents an output voltage of the circuit 600.

An external high inductance gate inductor $L_g$ 362 may be employed for 50Ω impedance matching and passive amplification. The input matching circuit amplifies the input voltage and noise from the antenna with the effective inductance of the input matching circuit. The input matching circuit may include the gate inductor $L_g$ 362, the depletion capacitor $C_{dn}$ 322, the depletion capacitor $C_{dp}$ 328, and the source inductor $L_s$ 380.

If the inductance is large enough, the output noise of the amplifier 300 will be dominated by the amplified input noise. The signal-to-noise ratio is not much degraded due to the input referred noise of the amplifier 300, and the resulting noise figure (NF) can be further improved.

Figure 7:
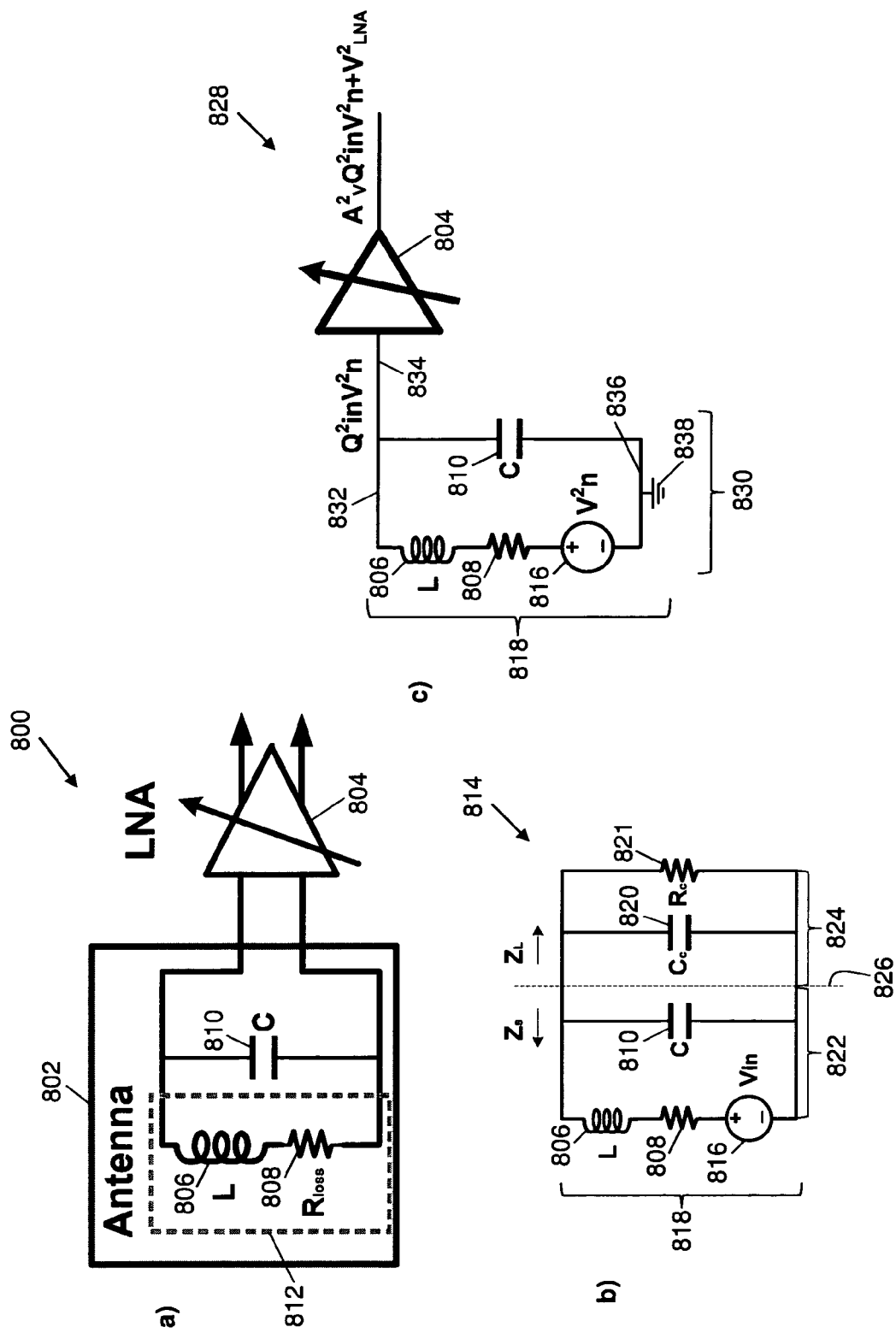
FIG. 7a shows a schematic diagram of a high impedance passive amplification circuit according to one embodiment.
FIG. 7b shows a schematic diagram of an equivalent circuit of a high impedance passive amplification circuit according to one embodiment.
FIG. 7c shows a schematic diagram of an equivalent circuit of a high impedance passive amplification circuit according to one embodiment.

FIG. 7a shows a schematic diagram of high impedance passive amplification circuit 800. The circuit 800 has an antenna 802 and an amplifier 804. The antenna 802 has an inductor 806 and a resistor 808 connected in series. The antenna 802 also has a capacitor 810 connected in parallel with a series connection 812 of the inductor 806 and the resistor 808. The amplifier 804 may be a low noise amplifier. In one embodiment, the amplifier 804 may correspond to the amplifier 200 or the amplifier 300 as described above.

FIG. 7b shows a schematic diagram of an equivalent circuit 814 of the circuit 800 of FIG. 7a. The equivalent circuit 814 includes the inductor 806, the resistor 808 and a voltage source 816 connected in series. The equivalent circuit 814 also includes the capacitor 810 connected in parallel with a series connection 818 of the inductor 806, the resistor 808 and the voltage source 818. The equivalent circuit 814 includes a further capacitor 820 connected in parallel with the capacitor 810, and a further resistor 821 connected in parallel with the further capacitor 820. The equivalent circuit 814 is divided into a first portion 822 and a second portion 824 by a dotted line 826. The first portion 822 of the equivalent circuit 814 includes the inductor 806, the resistor 808, the voltage source 818 and the capacitor 810. The second portion 824 of the equivalent circuit 814 includes further capacitor 820 and the further resistor 821. A source impedance $Z_S$ can be calculated based on the first portion 822 of the equivalent circuit 814. A load impedance $Z_L$ can be calculated based on the second portion 824 of the equivalent circuit 814. In other words, the source impedance $Z_S$ shown in FIG. 7b may be calculated based on the impedance of the antenna 802 shown in FIG. 7a. The load impedance $Z_L$ shown in FIG. 7a may be calculated based on the impedance of the amplifier 804 shown in FIG. 7b.

FIG. 7c shows a schematic diagram of an equivalent circuit 828 of the circuit 800 for noise calculation. The equivalent circuit 828 includes the inductor 806, the resistor 808 and a voltage source 816 connected in series. The equivalent circuit 828 includes the capacitor 810 connected in parallel with a series connection 818 of the inductor 806, the resistor 808 and the voltage source 818, forming a parallel arrangement 830. The equivalent circuit 828 also includes the amplifier 804. One end 832 of the parallel arrangement 830 is coupled to an input terminal 834 of the amplifier 804. The other end 836 of the parallel arrangement 830 is coupled to ground 838.

The voltage gain of the amplifier 804 can be calculated using the following equation:

$$A_V = Q_{in} \cdot g_m \cdot R_{Load} \cdot \frac{Z_L}{Z_S + Z_L}$$

where $A_V$ is voltage gain of the amplifier 804, $Q_{in}$ is an input charge (e.g. charge of capacitor 810), $g_m$ is transconductance, $R_{Load}$ is load resistance (e.g. resistance of resistor 808), $Z_L$ is load impedance, and $Z_S$ is source impedance.

The noise figure (NF) can be calculated using the following equation:

$$NF = 10\log\left(\frac{V_n^2 + V_{LNA\_inputrefer}^2}{V_n^2}\right) = 10\log\left(\frac{A_v^2 Q_{in}^2 V_n^2 + V_{LNA\_outputrefer}^2}{A_v^2 Q_{in}^2 V_n^2}\right) \quad (1)$$

where NF is noise figure, $V_n$ is voltage of the voltage source 816, $V_{LNA\_inputrefer}$ is a reference input voltage of the amplifier 804, $A_V$ is voltage gain, $Q_{in}$ is a quality factor of the input matching circuit, and $V_{LNA\_outputrefer}$ is a reference input voltage of the amplifier 804.

Referring to equation (1), if $A_v^2 Q_{in}^2 V_n^2 >> V_{LNA}^2$, the output noise is dominated by the input noise and the noise figure can be effectively reduced significantly.

The maximum passive amplification can be applied to the amplifier 300 for non-50Ω impedance matching applications. Additional gain, improved NF and further reduction in power can be achieved by using the maximum passive amplification.

Figure 8:
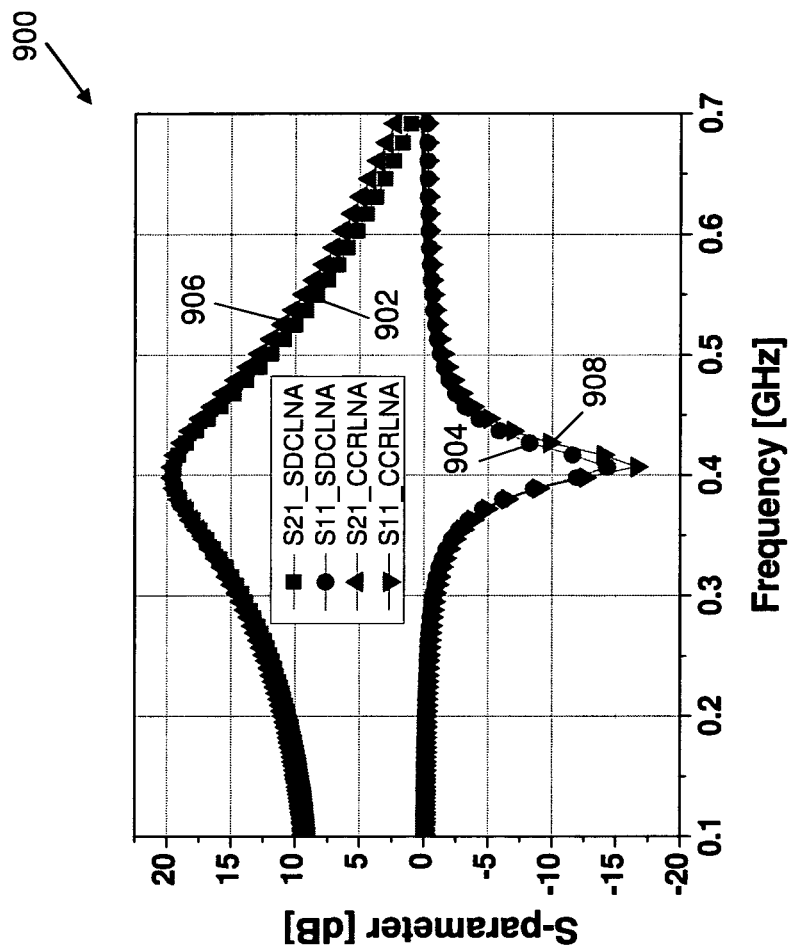
FIG. 8 shows a graph of s-parameter plotted against frequency according to one embodiment.

The amplifier 300 and the conventional SDCLNA 100 are simulated at about 1.0 V, about 27° C. and with 50Ω impedance matching. FIG. 8 shows a graph 900 of s-parameter plotted against frequency. Plot 902 shows insertion loss (S21) of the conventional SDCLNA 100 plotted against frequency. Plot 904 shows input return loss (S11) of the conventional SDCLNA 100 plotted against frequency. Plot 906 shows insertion loss (S21) of the amplifier 300 plotted against frequency. Plot 908 shows input return loss (S11) of the amplifier 300 plotted against frequency. It can be observed from graph 900 that the s-parameters of the conventional SDCLNA 100 and the amplifier 300 are similar.

Figure 9:
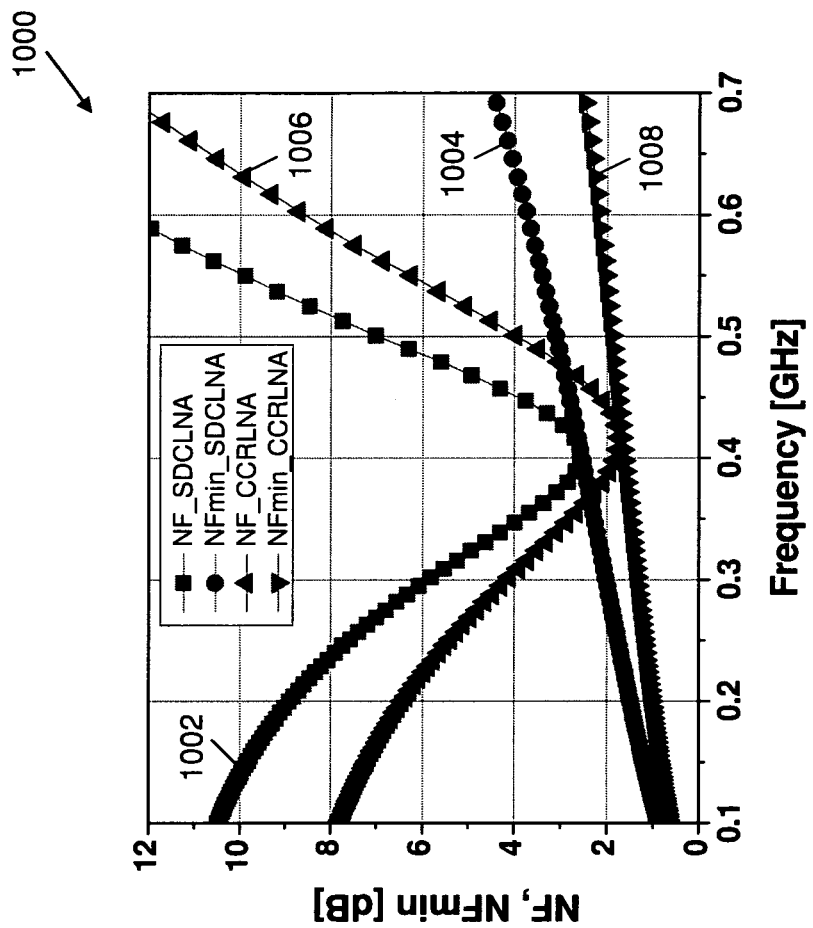
FIG. 9 shows a graph of noise figure (NF) plotted against frequency according to one embodiment.

FIG. 9 shows a graph 1000 of noise figure (NF) plotted against frequency. Plot 1002 shows the NF of the conventional SDCLNA 100 plotted against frequency. Plot 1004 shows the minimum NF of the conventional SDCLNA 100 plotted against frequency. Plot 1006 shows the NF of the amplifier 300 plotted against frequency. Plot 1008 shows the minimum NF of the amplifier 300 plotted against frequency. The NF of the conventional SDCLNA 100 is about 2.6 dB. The NF of the amplifier 300 is about 1.8 dB. In comparison to the conventional SDCLNA 100, the NF of the amplifier 300 is improved at the same power consumption. The NF of the amplifier 300 may be improved due to the increased transconductance of the current reuse structure of the amplifier 300.

Figure 10:
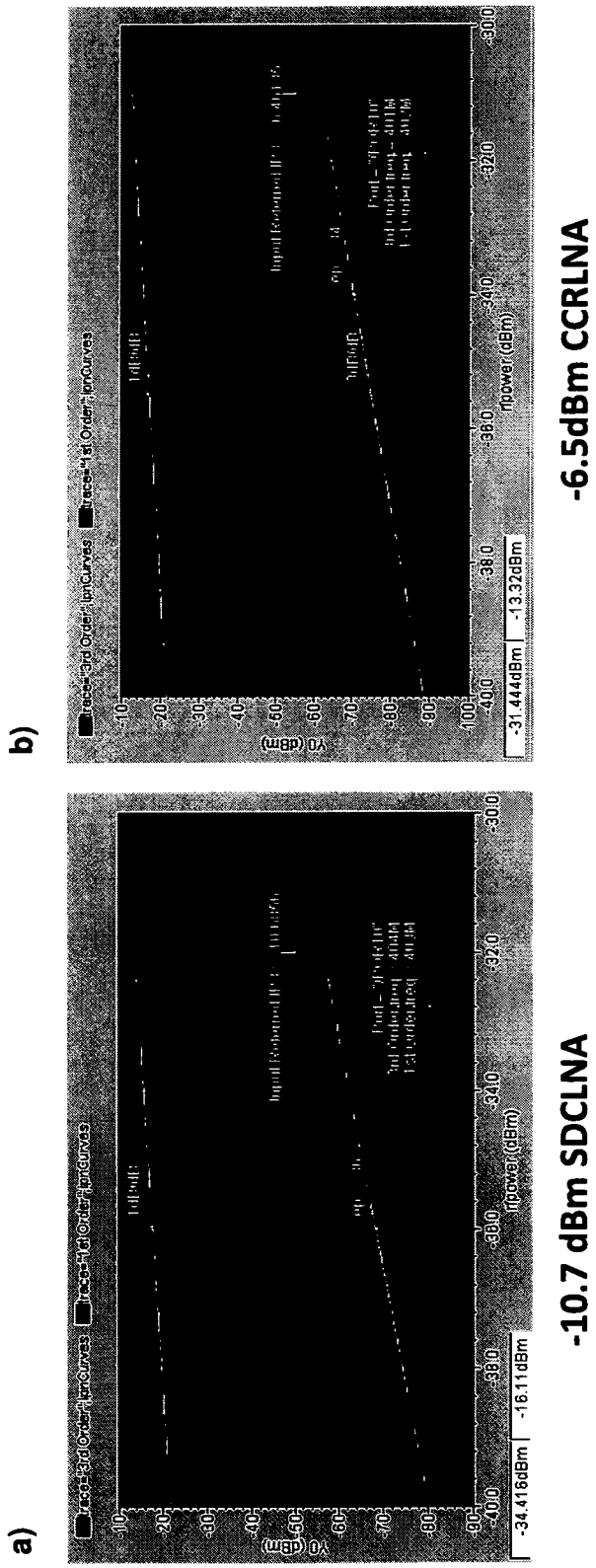
FIG. 10a shows a simulated third order input intercept point (IIP3) of a conventional source degeneration cascode low noise amplifier (SDCLNA).
FIG. 10b shows a simulated third order input intercept point (IIP3) of an amplifier according to one embodiment.

FIG. 10a shows the simulated third order input intercept point IIP3 of the conventional SDCLNA 100. The IIP3 of the conventional SDCLNA 100 is about −10.7 dBm. FIG. 10b shows the shows the simulated third order input intercept point IIP3 of the amplifier 300. The IIP3 of the amplifier 300 is about −6.5 dBm. It can be observed that in comparison to the conventional SDCLNA 100, the IIP3 of the amplifier 300 is improved.

FIG. 11 shows a table 1200 listing the simulation results of the conventional SDCLNA 100 and the amplifier 300. Column 1202 shows the targeted simulation results. Column 1204 shows the simulation results of the conventional SDCLNA 100. Column 1206 shows the simulation results of the amplifier 300. The amplifier 300 shows better performance than the conventional SDCLNA 100.

Figure 12:
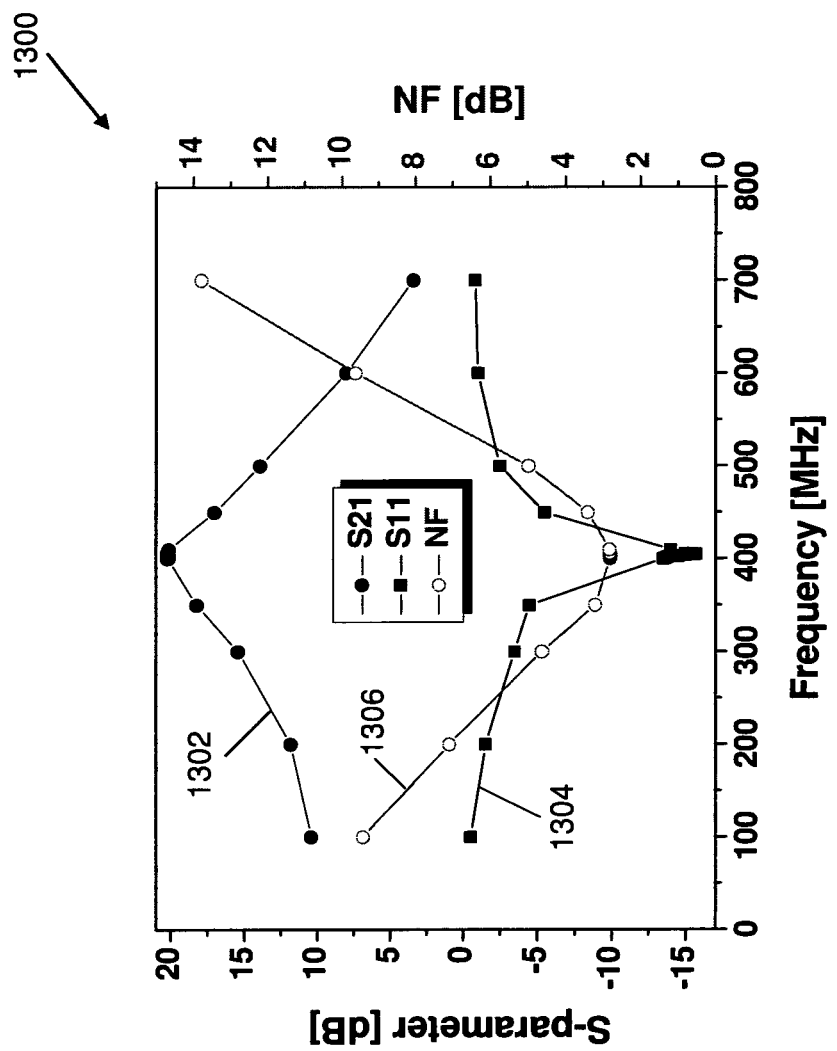
FIG. 12 shows a graph illustrating experimental results of an amplifier according to one embodiment.

FIG. 12 shows a graph 1300 illustrating experimental results of the amplifier 300 at 50Ω impedance matching and at a frequency range of 401 MHz to 406 MHz. Plot 1302 shows the insertion loss (S21) of the amplifier 300 plotted against frequency. Plot 1304 shows the input return loss (S11) of the amplifier 300 plotted against frequency. Plot 1306 shows the noise figure (NF) of the amplifier 300 plotted against frequency. The NF of the amplifier 300 with 50Ω matching is about 2.9 dB.

Figure 13:
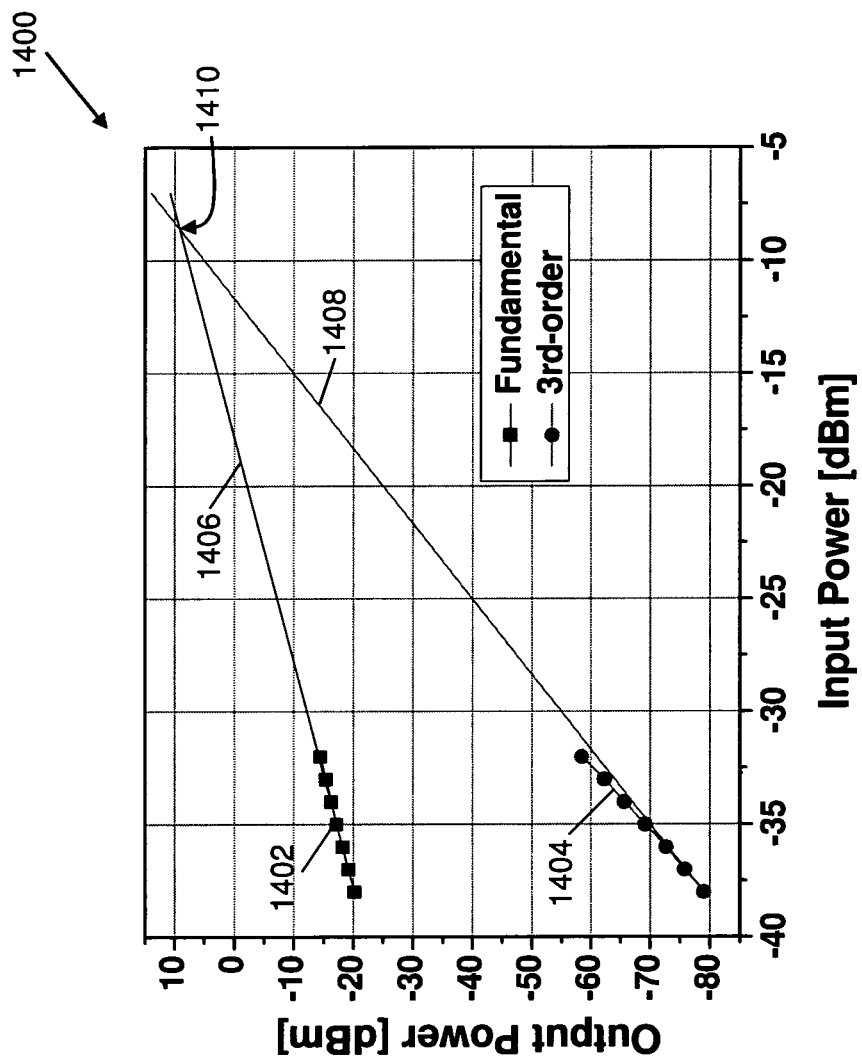
FIG. 13 shows a graph illustrating third order input intercept point (IIP3) linearity measurements of an amplifier according to one embodiment.

FIG. 13 shows a graph 1400 illustrating third order input intercept point (IIP3) linearity measurements of the amplifier 300. Plot 1402 shows output power plotted against input power for a fundamental signal. Plot 1404 shows output power plotted against input power for a third-order product of the fundamental signal. A fitted line 1406 for plot 1402 is drawn and a fitted line 1408 for plot 1404 is drawn. It can be observed from an intersection point 1410 of line 1406 and line 1408 that a −8.1 dBm of IIP3 is measured for the amplifier 300.

FIG. 14 shows a table 1500 listing simulation results of four conventional amplifiers (see references [2] "A 1V wireless transceiver for an ultra-low-power SoC for biotelemetry applications," JSSC2008, [3] "A 1V wireless transceiver for an ultra-low-power SoC for biotelemetry applications," JSSC2008, [4] "A subthreshold low-noise amplifier optimized for ultra-low-power applications in the ISM band," TMTT2008, and [5] "A novel ultra-low power (ULP) low noise amplifier using differential inductor feedback" ESSCIRC2006), preliminary measurements of the amplifier 300 with 50Ω impedance matching, and simulation results of the amplifier 300 with high impedance matching (non-50Ω matching). Columns 1502 to 1508 show the simulation results of the four conventional amplifiers respectively. Column 1510 shows the preliminary measurements of the amplifier 300 with 50Ω impedance matching. Column 1512 shows the simulation results of the amplifier 300 with high impedance matching (non-50Ω matching).

With 50Ω impedance matching, the amplifier 300 has a gain of 20.2 dB, a noise figure of 2.9 dB, an IIP3 of −8.1 dBm, a power consumption of 150 μW at 1-V and a figure of merit (F.O.M.) of 20. With high impedance matching, the amplifier 300 has a gain of 22 dB, a noise figure of 1.5 dB, an IIP3 of −13 dBm, a power consumption of 100 μW at 1-V and a figure of merit (F.O.M.) of 22.6. In comparison with the four conventional amplifiers, the amplifier 300 exhibits an improved performance with 50Ω impedance matching and with high impedance matching.

Figure 15:
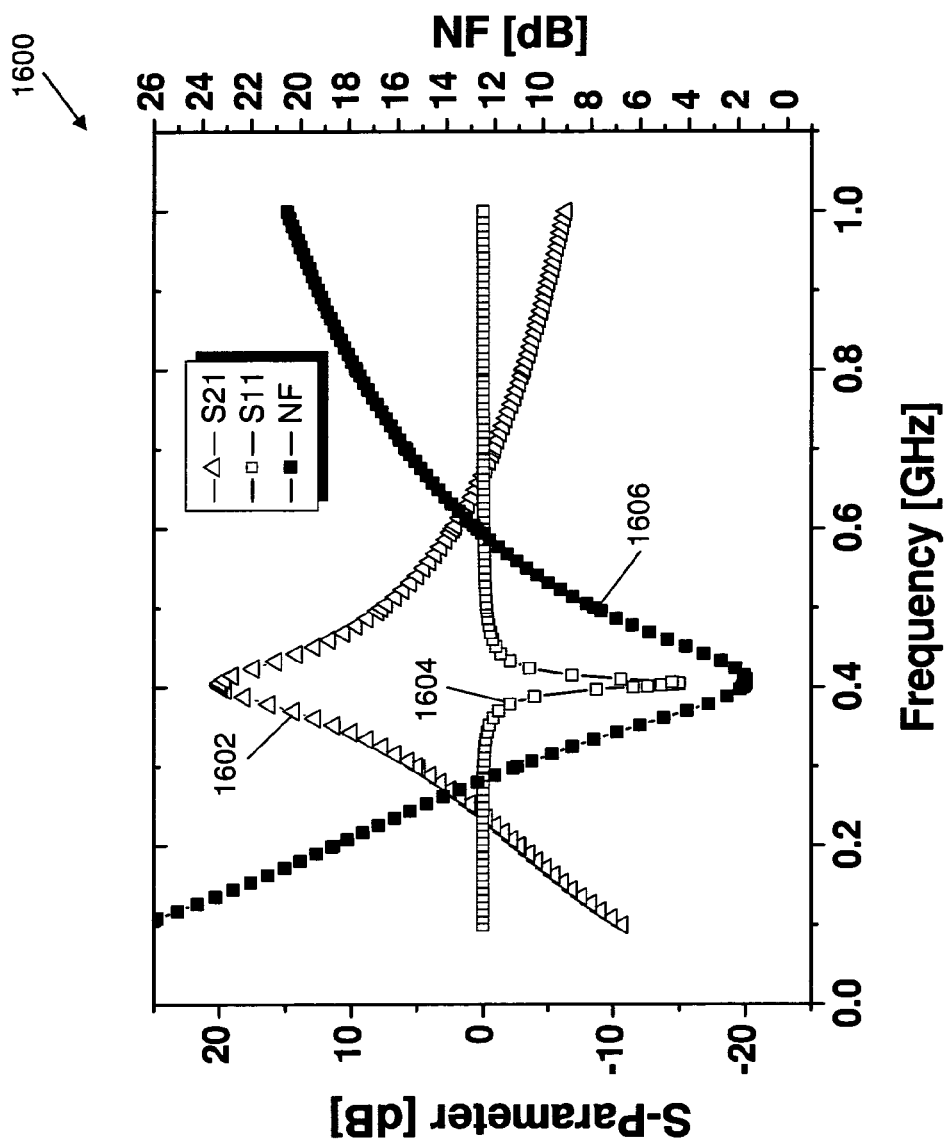
FIG. 15 shows a graph illustrating simulation results of an amplifier with high impedance passive network (non-50Ω matching) according to one embodiment.

FIG. 15 shows a graph 1600 illustrating the simulation results of the amplifier 300 with high impedance passive network (non-50Ω matching). Plot 1602 shows the insertion loss (S21) of the amplifier 300 plotted against frequency. Plot 1604 shows the input return loss (S11) of the amplifier 300 plotted against frequency. Plot 1606 shows the noise figure (NF) of the amplifier 300 plotted against frequency. The NF of the amplifier 300 with non-50Ω matching is about 1.6 dB which is improved as compared to the NF of the amplifier 300 with 50Ω matching (e.g. 1.8 dB (see FIG. 9) and 2.9 dB (see FIG. 14)).

Simulation of the noise figure (NF) of the amplifier 300 at high impedance (non-50Ω matching) can be carried out using various methods. One possible method is the noise voltage method. Referring to the above-mentioned equation (1), $V_n^2 + V_{LNA\_inputrefer}$ and $A_v^2 Q_{in}^2 V_n^2 + V_{LNA\_outputrefer}$ can be simulated. The NF of the amplifier 300 obtained from the noise voltage method is 1.617 dB. Another possible method is the S-parameter method where serial network is transformed to parallel network and conventional S-parameter simulation is used. The NF of the amplifier 300 obtained from the S-parameter method is 1.566 dB.

The amplifier 300 has a current reuse topology and requires no additional power or complexity required. Improvement of noise and linearity performance can be achieved without increase in power consumption. Power consumption can be reduced by more than 50%. Application of maximum passive amplification to the amplifier 300 to further reduce the power consumption for applications where 50Ω input matching may not be required. Nevertheless, high impedance matching can still result in further reduction in power consumption of the amplifier 300. Smaller passive components can be used in the amplifier 300 for higher integration.

The amplifier 300 can be employed for receiver radio frequency (RF) front-ends as a low-noise amplifier in different applications (e.g. ultra-low-power implantable and wearable wireless sensors for biomedical applications). For example, the amplifier 300 can be applied to a full transceiver for MedRadio regulation compliant implant and wearable sensor applications where sufficient gain and noise performances are required and ultra-low-power consumption for prolonged battery life is provided. The amplifier 300 can be used in a low-voltage sub-mW transceiver for biomedical applications where the amplifier 300 is a key building block in the receiver part.

Figure 16:
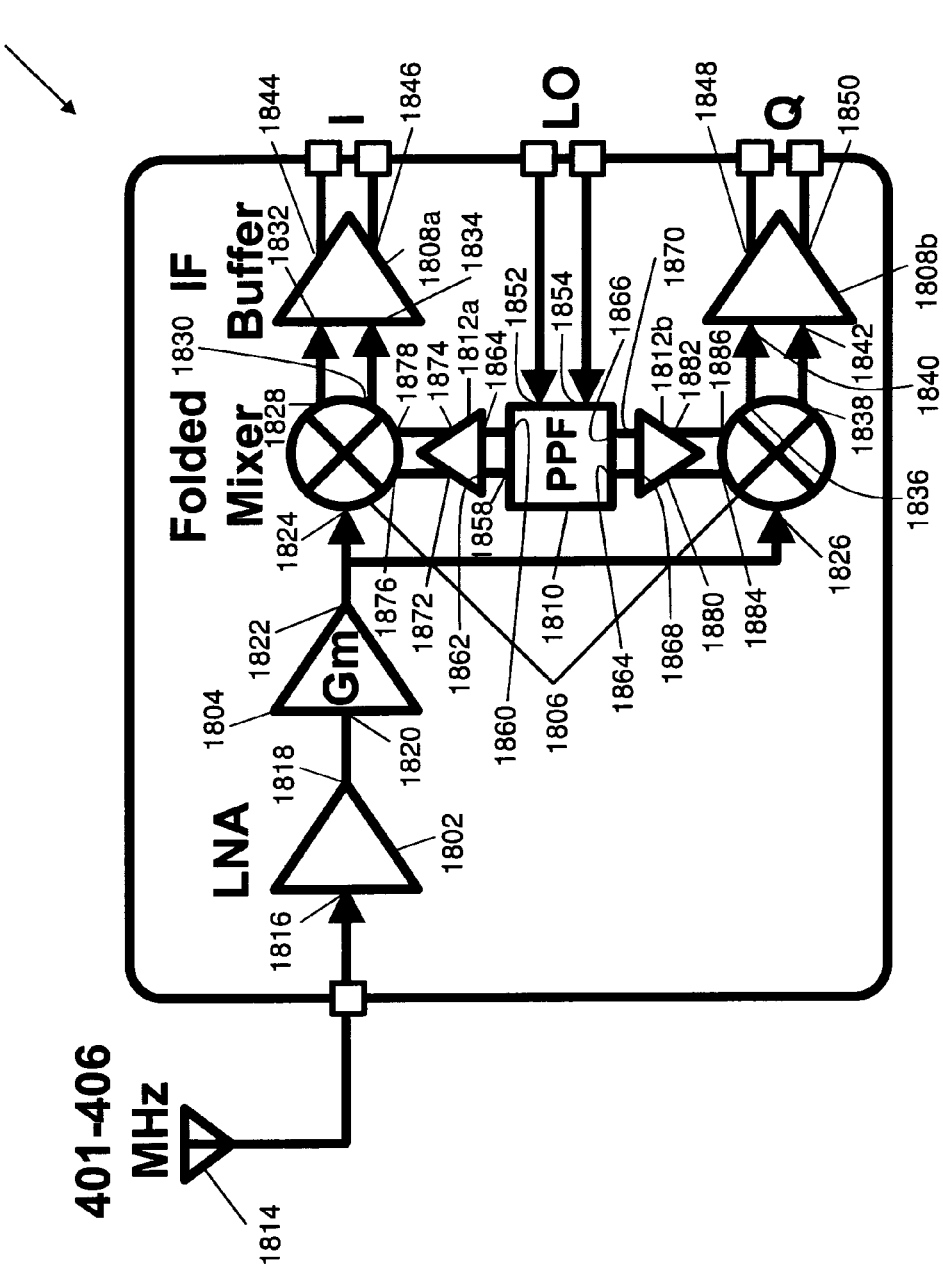
FIG. 16 shows a block diagram of a receiver RF front-end according to one embodiment.

FIG. 16 shows a block diagram of a receiver RF front-end 1800. The receiver RF front-end 1800 includes an amplifier 1802 (e.g. low noise amplifier (LNA)). The amplifier 1802 may correspond to the amplifier 300 described above. The receiver RF front-end 1800 also includes a transconductor 1804, an in-phase/quadrature (I/Q) folded active mixer 1806, a first intermediate frequency (IF) buffer 1808a and a second IF buffer 1808b, and a two-stage passive polyphase filter (PPF) 1810 with a first buffer 1812a and a second buffer 1812b. The receiver RF front-end 1800 has an antenna 1814.

The antenna 1814 is coupled to an input terminal 1816 of the amplifier 1802. An output terminal 1818 of the amplifier 1802 is coupled to an input terminal 1820 of the transconductor 1804. An output terminal 1822 of the transconductor 1804 is coupled to a first input terminal 1824 and a second input terminal 1826 of the I/Q folded mixer 1806. A first output terminal 1828 and a second output terminal 1830 of the I/Q folded mixer 1806 are coupled to a first input terminal 1832 and a second input terminal 1834 of the first IF buffer 1808a respectively. A third output terminal 1836 and a fourth output terminal 1838 of the I/Q folded mixer 1806 are coupled to a first input terminal 1840 and a second input terminal 1842 of the second IF buffer 1808b respectively. The first IF buffer 1808a has a first output terminal 1844 and a second output terminal 1846 for transmitting in-phase signals. The second IF buffer 1808b has a first output terminal 1848 and a second output terminal 1850 for transmitting quadrature signals. The PPF 1810 has a first input terminal 1852 and a second input terminal 1854 for receiving I/Q local oscillator (LO) signal from an external LO source (not shown). A first output terminal 1856 and a second output terminal 1858 of the PPF 1810 are coupled to a first input terminal 1860 and a second input terminal 1862 of the first buffer 1812a respectively. A third output terminal 1864 and a fourth output terminal 1866 of the PPF 1810 are coupled to a first input terminal 1868 and a second input terminal 1870 of the second buffer 1812b respectively. A first output terminal 1872 and a second output terminal 1874 of the first buffer 1812a are coupled to a third input terminal 1876 and a fourth input terminal 1878 of the I/Q folded mixer 1806 respectively. A first output terminal 1880 and a second output terminal 1882 of the second buffer 1812b are coupled to a fifth input terminal 1884 and a sixth input terminal 1886 of the I/Q folded mixer 1806 respectively.

The two-stage passive polyphase filter 1810 with a first buffer 1812a and a second buffer 1812b are used to drive the mixer 1806 for I/Q LO signal generation from the external LO source (not shown). The two poles $1/R_1 C_1$ and $1/R_2 C_2$ are placed at 395 and 410 MHz, respectively, to broaden the frequency response. Considering low power consumption, the LO buffer (e.g. including first buffer 1812a and second buffer 1812b) may be an ac-coupled inverter type differential amplifier where a large differential swing can be obtained for a given operating current due to its push-pull operation.

In addition, a constant-gm bias circuitry may be included to supply accurate reference current to all the blocks (e.g. amplifier 1802, transconductor 1804, I/Q folded active mixer 1806, first IF buffer 1808a, second IF buffer 1808b, PPF 1810 with first buffer 1812a and second buffer 1812b) of the receiver RF front-end 1800 regardless of process, voltage, and temperature (PVT) variations. Single-ended paths are employed up to the mixer 1806 to minimize the current consumption and to avoid the use of a lossy balun at the receiver input. To minimize power in each of the blocks, low-power design techniques such as current-reuse and weak inversion biasing are utilized with a 1-V supply voltage through the receiver chain (e.g. receiver RF front-end 1800).

The antenna 1814 of the receiver RF front-end 1800 has a RF input band of 401-406 MHz. However, the narrow 100 kHz channel bandwidth of the 401-402 MHz and 405-406 MHz wing bands in MedRadio may severely be corrupted by the flicker noise and DC offset at baseband. Therefore, the RF input band of 401-406 MHz is downconverted to a low-IF of 50Ω kHz. The 50Ω kHz IF is selected as a compromise in order to avoid the 1/f noise and at the same time minimize the required power consumption of the IF blocks (e.g. first IF buffer 1808a and second IF buffer 1808b).

Figure 17:
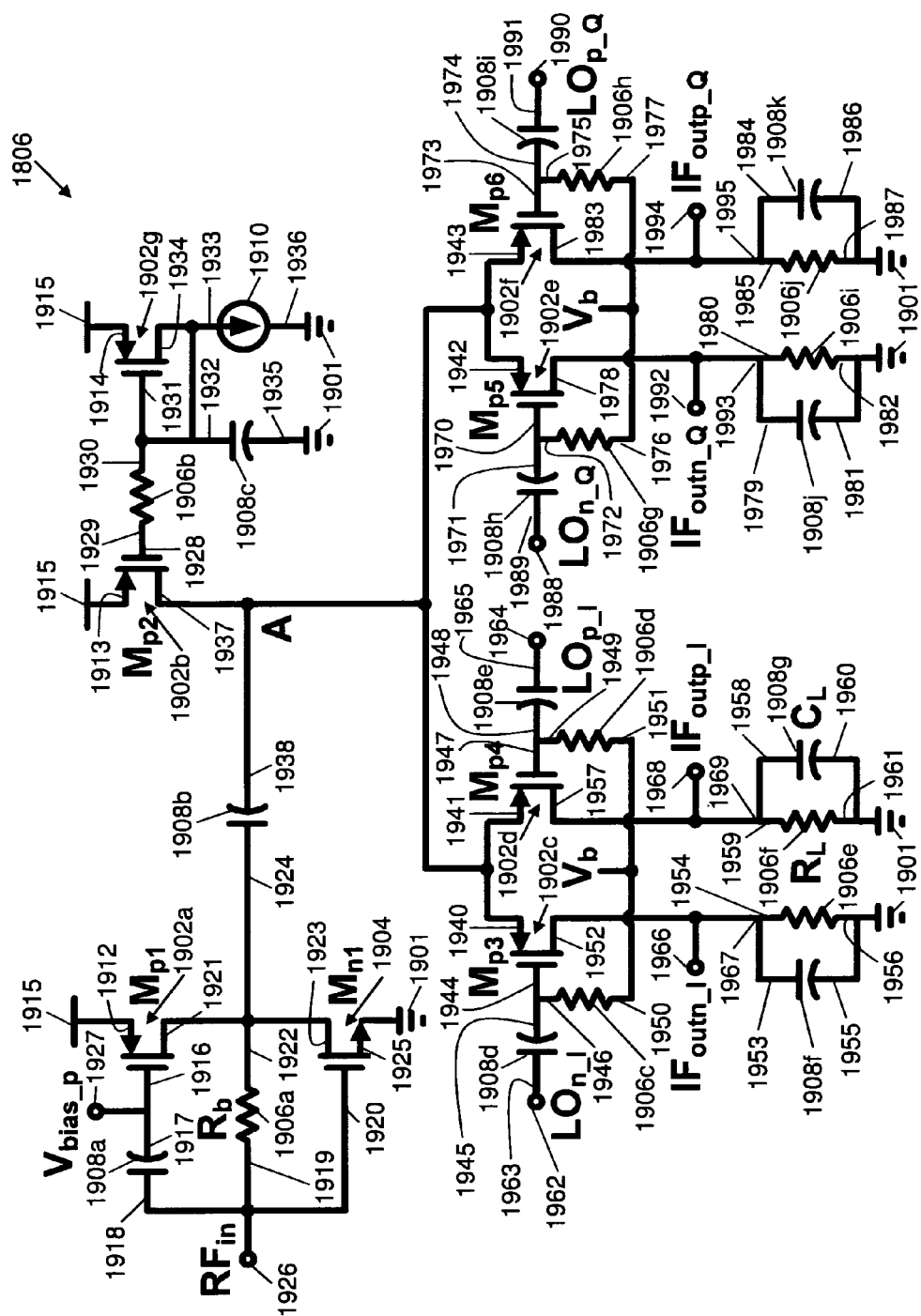
FIG. 17 shows a schematic diagram of a folded active mixer according to one embodiment.

The mixer 1806 is used to alleviate the headroom issue and have separate biasing for the transconductor 1804 and the switching part of the mixer 1806 for better optimization. FIG. 17 shows a schematic diagram of the folded active mixer 1806. The mixer 1806 has seven p-channel MOSFET (PMOS) 1902a-g, one n-channel MOSFET (NMOS) 1904, ten resistors 1906a j, eleven capacitors 1908a-k and one current source 1910. A source terminal 1912 of the first PMOS 1902a, a source terminal 1913 of the second PMOS 1902b and a source terminal 1914 of the seventh PMOS 1902g are coupled to a first voltage reference point 1915. A gate terminal 1916 of the first PMOS 1902a is coupled to a negative terminal 1917 of the first capacitor 1908a. A positive terminal 1918 of the first capacitor 1908a is coupled to a first terminal 1919 of the first resistor 1906a and a gate terminal 1920 of the NMOS 1904. A drain terminal 1921 of the first PMOS 1902a is coupled to a second terminal 1922 of the first resistor 1906a, a drain terminal 1923 of the NMOS 1904, and a positive terminal 1924 of the second capacitor 1908b. A source terminal 1925 of the NMOS 1904 is coupled to ground 1901. The mixer 1806 has a first input terminal 1926 coupled to the positive terminal 1918 of the first capacitor 1908a, the first terminal 1919 of the first resistor 1906a and the gate terminal 1920 of the NMOS 1904. The mixer 1806 also has a bias voltage input terminal 1927 coupled between the gate terminal 1916 of the first PMOS 1902a and the negative terminal 1917 of the first capacitor 1908a.

The gate terminal 1928 of the second PMOS 1902b is coupled to a first terminal 1929 of the second resistor 1906b. A second terminal 1930 of the second resistor 1906b is coupled to a gate terminal 1931 of the seventh PMOS 1902g, a positive terminal 1932 of the third capacitor 1908c, a first terminal 1933 of the current source 1910 and a drain terminal 1934 of the seventh PMOS 1902g. The negative terminal 1935 of the third capacitor 1908c and the second terminal 1936 of the current source 1910 are respectively coupled to ground 1901. The drain terminal 1937 of the second PMOS 1902b is coupled to a negative terminal 1938 of the second capacitor 1908b, a source terminal 1940 of the third PMOS 1902c, a source terminal 1941 of the fourth PMOS 1902d, a source terminal 1942 of the fifth PMOS 1902e, and a source terminal 1943 of the sixth PMOS 1902f.

A gate terminal 1944 of the third PMOS 1902c is coupled to a negative terminal 1945 of the fourth capacitor 1908d and a first terminal 1946 of the third resistor 1906c. A gate terminal 1947 of the fourth PMOS 1902d is coupled to a negative terminal 1948 of the fifth capacitor 1908e and a first terminal 1949 of the fourth resistor 1906d. A second terminal 1950 of the third resistor 1906c is coupled to a second terminal 1951 of the fourth resistor 1906d. A drain terminal 1952 of the third PMOS 1902c is coupled to a positive terminal 1953 of the sixth capacitor 1908f and a first terminal 1954 of the fifth resistor 1906e. A negative terminal 1955 of the sixth capacitor 1908f is coupled to a second terminal 1956 of the fifth resistor 1906e. The negative terminal 1955 of the sixth capacitor 1908f and second terminal 1956 of the fifth resistor 1906e are coupled to ground 1901. A drain terminal 1957 of the fourth PMOS 1902d is coupled to a positive terminal 1958 of the seventh capacitor 1908g and a first terminal 1959 of the sixth resistor 1906f. A negative terminal 1960 of the seventh capacitor 1908g is coupled to a second terminal 1961 of the sixth resistor 1906f. The negative terminal 1960 of the seventh capacitor 1908g and the second terminal 1961 of the sixth resistor 1906f are coupled to ground 1901.

The mixer 1806 includes a second input terminal 1962 coupled to a positive terminal 1963 of the fourth capacitor 1908d, and a third input terminal 1964 coupled to a positive terminal 1965 of the fifth capacitor 1908e. The mixer 1806 includes a first output terminal 1966 coupled between the drain terminal 1952 of the third PMOS 1902c and a coupling point 1967. The mixer 1806 includes a second output terminal 1968 coupled between the drain terminal 1957 of the fourth PMOS 1902d and a coupling point 1969. A bias voltage $V_b$ is applied between the second terminal 1950 of the third resistor 1906c and the second terminal 1951 of the fourth resistor 1906d.

A gate terminal 1970 of the fifth PMOS 1902e is coupled to a negative terminal 1971 of the eighth capacitor 1908h and a first terminal 1972 of the seventh resistor 1906g. A gate terminal 1973 of the sixth PMOS 1902f is coupled to a negative terminal 1974 of the ninth capacitor 1908i and a first terminal 1975 of the eighth resistor 1906h. A second terminal 1976 of the seventh resistor 1906g is coupled to a second terminal 1977 of the eighth resistor 1906h. A drain terminal 1978 of the fifth PMOS 1902e is coupled to a positive terminal 1979 of the tenth capacitor 1908j and a first terminal 1980 of the ninth resistor 1906i. A negative terminal 1981 of the tenth capacitor 1908j is coupled to a second terminal 1982 of the ninth resistor 1906i. The negative terminal 1981 of the tenth capacitor 1908j and the second terminal 1982 of the ninth resistor 1906i are coupled to ground 1901. A drain terminal 1983 of the sixth PMOS 1902f is coupled to a positive terminal 1984 of the eleventh capacitor 1908k and a first terminal 1985 of the tenth resistor 1906j. A negative terminal 1986 of the eleventh capacitor 1908k is coupled to a second terminal 1987 of the tenth resistor 1906j. The negative terminal 1986 of the eleventh capacitor 1908k and the second terminal 1987 of the tenth resistor 1906j are coupled to ground 1901.

The mixer 1806 includes a fourth input terminal 1988 coupled to a positive terminal 1989 of the eighth capacitor 1908h, and a fifth input terminal 1990 coupled to a positive terminal 1991 of the ninth capacitor 1908i. The mixer 1806 includes a third output terminal 1992 coupled between the drain terminal 1978 of the fifth PMOS 1902e and a coupling point 1993. The mixer 1806 includes a fourth output terminal 1994 coupled between the drain terminal 1983 of the sixth PMOS 1902f and a coupling point 1995. A bias voltage $V_b$ is applied between the second terminal 1976 of the seventh resistor 1906g and the second terminal 1977 of the eighth resistor 1906h.

Referring back to FIG. 16, the transconductor 1804 is an ac-coupled current reuse inverter type where the biasing for the transistor $M_{p1}$ (e.g. first PMOS 1902a) and transistor $M_{n1}$ (e.g. NMOS 1904) are separated in order to support low supply voltage and reduce its sensitivity to PVT variations. A single tail current source $M_{p2}$ (e.g. second PMOS 1902b) is used in the I/Q mixer 1806 in order to minimize mismatch between the two mixer paths. The mixer 1806 is a single-balanced active mixer with parallel RC load for low-pass filtering in the baseband.

Figure 18:
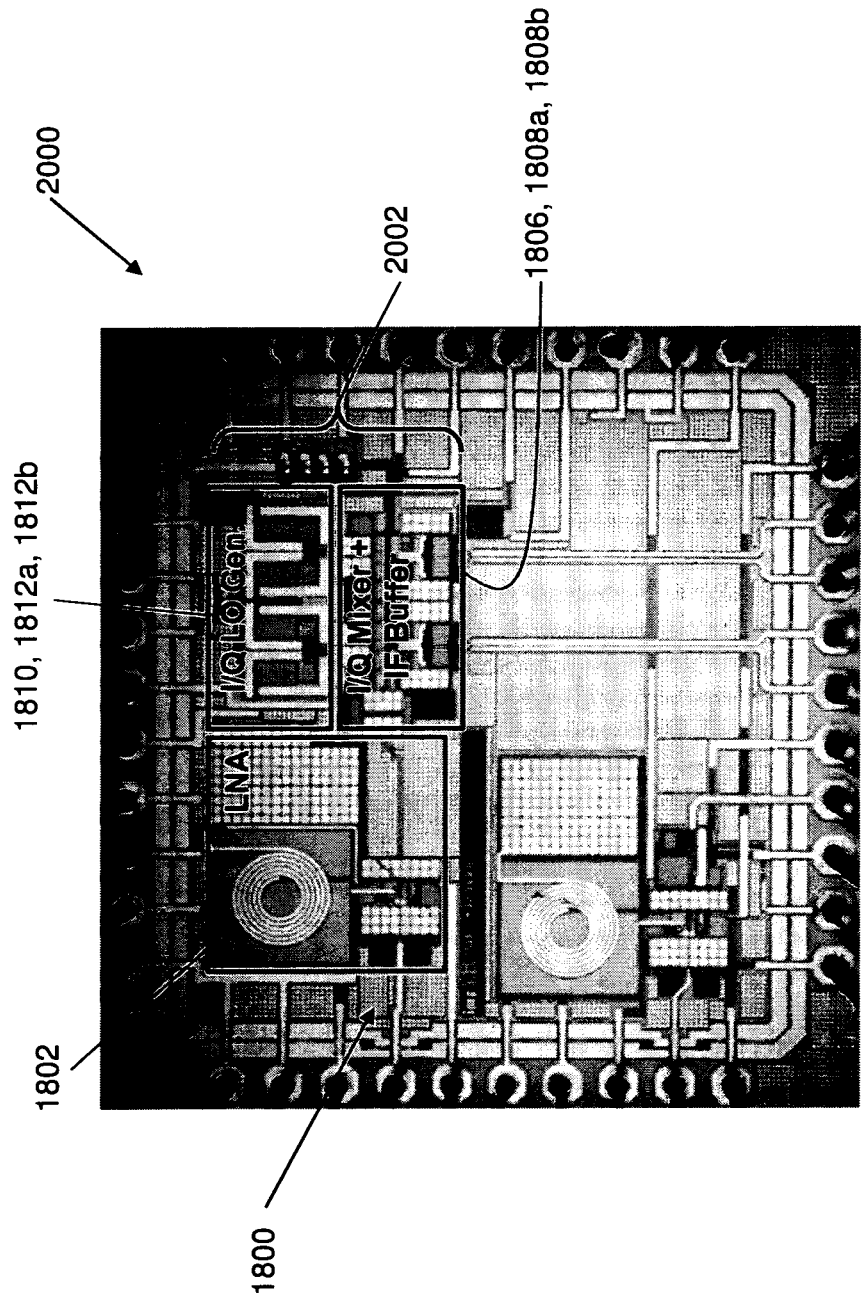
FIG. 18 shows a chip microphotograph of a receiver RF front-end according to one embodiment.

The receiver RF front-end 1800 can be fabricated in one-poly six-metal (1P 6M) 0.18-μm CMOS process. The chip microphotograph 2000 of the receiver RF front-end 1800 is shown in FIG. 18. The total chip area of the core 2002 (e.g. including the amplifier 1802, the I/Q mixer 1806, the first IF buffer 1808a, the second IF buffer 1808b, the PPF 1810 with the first buffer 1812a and the second buffer 1812b) is 0.7 $mm^2$. All pads include electrostatic discharge (ESD) circuits using diode pairs.

Figure 19:
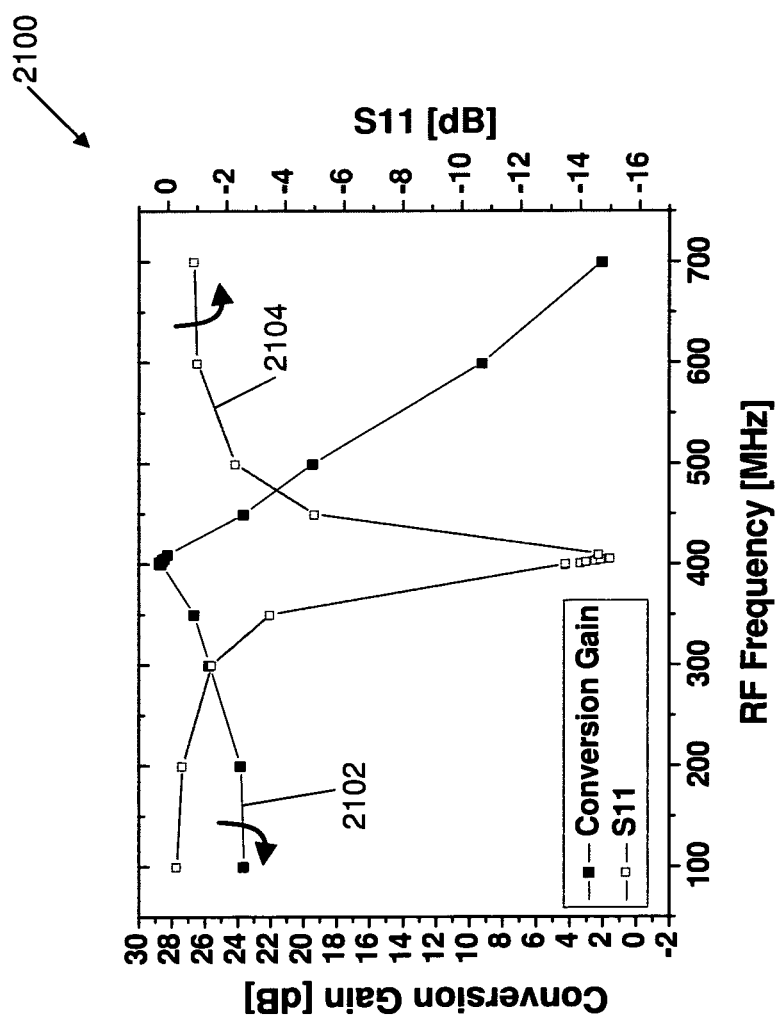
FIG. 19 shows a graph of measured conversion gain and input return loss (S11) of a receiver front-end plotted against RF input frequency at an intermediate frequency (IF) of 50Ω kHz according to one embodiment.

FIG. 19 shows a graph 2100 of measured conversion gain and input return loss (S11) of the receiver front-end plotted against RF input frequency at an intermediate frequency (IF) of 50Ω kHz. The external LO signal is provided by a signal generator. Plot 2102 shows measured conversion gain plotted RF input frequency at an IF of 50Ω kHz. Plot 2104 shows input return loss (S11) plotted against RF input frequency at an IF of 50Ω kHz. It can be observed from plot 2102 that there is a conversion gain of 28.7 dB.

Figure 20:
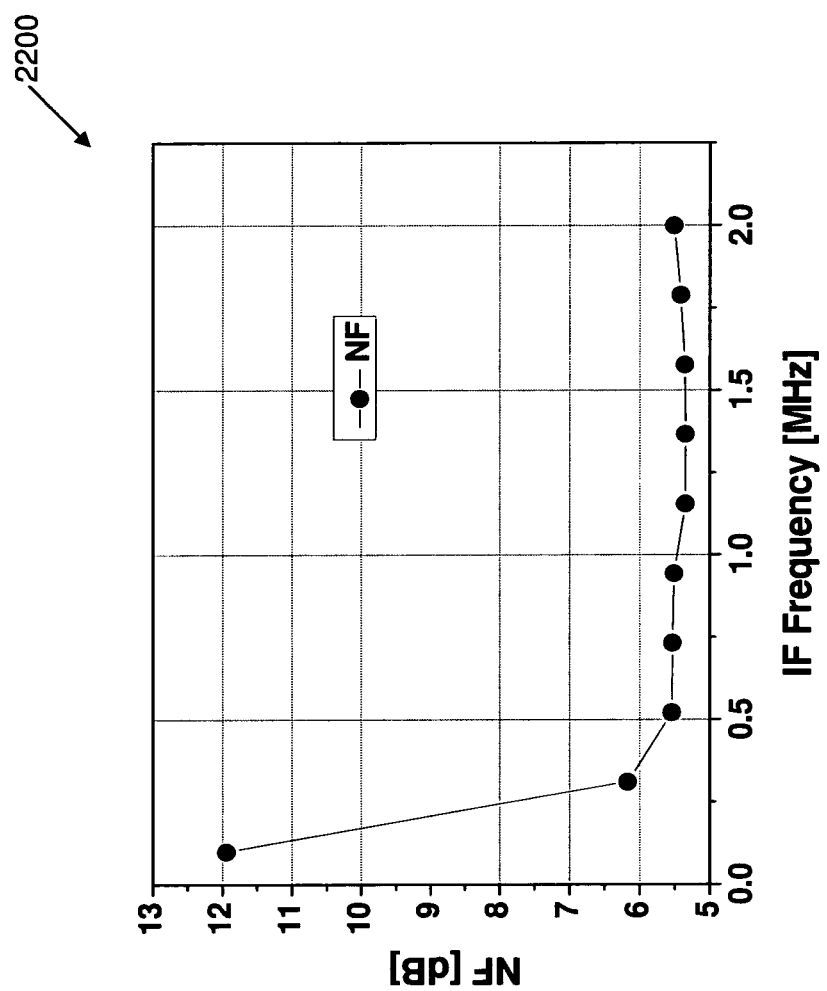
FIG. 20 shows a graph of noise figure (NF) measurement plotted against output frequency of a receiver front-end according to one embodiment.

FIG. 20 shows a graph 2200 of noise figure (NF) measurement plotted against output frequency of the receiver front-end. It can be observed from the graph 2200 that less than 5.5 dB of double-sideband (DSB) NF is obtained at an IF of 50Ω kHz to 2 MHz and at 28.7 dB of conversion gain.

Figure 21:
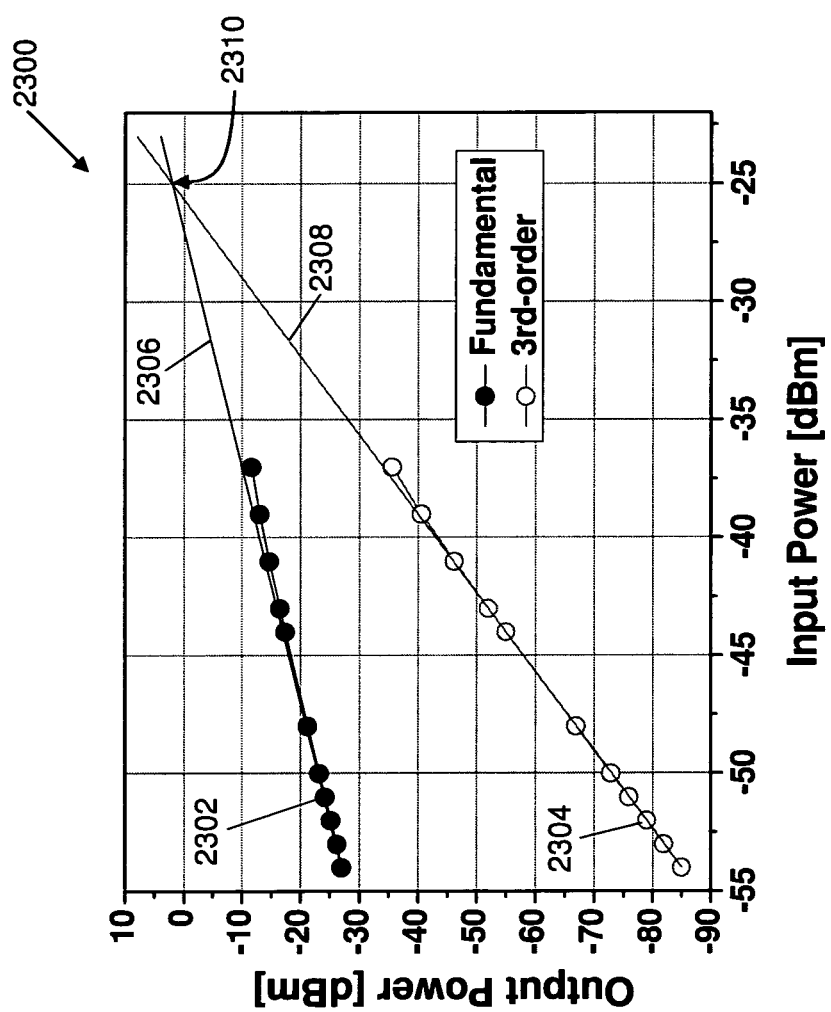
FIG. 21 shows a graph of third order input intercept point (IIP3) linearity measurement where two-tones at 402 and 402.1 MHz are applied to an input of a receiver front-end according to one embodiment.

FIG. 21 shows a graph 2300 of third order input intercept point (IIP3) linearity measurement where two-tones at 402 and 402.1 MHz are applied to the input of the receiver. Plot 2302 shows output power plotted against input power for a fundamental signal. Plot 2304 shows output power plotted against input power for a third-order product of the fundamental signal. A fitted line 2306 for plot 2302 is drawn and a fitted line 2308 for plot 2304 is drawn. It can be observed from an intersection point 2310 of line 2306 and line 2308 that a −25 dBm of IIP3 is measured for the RF receiver front-end.

FIG. 22 shows a table 2400 showing the measured results of four conventional receivers (see references [6] R. van Langevelde, M. van Elzakker, D. van Goor, H. Termeer, J. Moss, and A. J. Davie, "An ultra-low-power 868/915 MHz RF transceiver for wireless sensor network applications," in *Proc. IEEE RF Integ. Circuits Symp.*, 2009, pp. 113-116, [7] B. G. Perumana, R. Mukhopadhyay, S. Chakraborty, C.-H. Lee, and J. Laskar, "A low-power fully monolithic subthreshold CMOS receiver with integrated LO generation for 2.4 GHz wireless PAN applications," *IEEE J. of Solid-State Circuits*, vol. 43, no. 10, pp. 2229-2238, October 2008, [8] Y. Feng, G. Takemura, S. Kawaguchi, and P. Kinget, "Design of a high performance 2-GHz direct-conversion front-end with a single-ended RF input in 0.13 um CMOS," *IEEE J. of Solid-State Circuits*, vol. 44, no. 5, pp. 1380-1390, May 2009, and [9] M. Camus, B. Butaye, L. Garcia, M. Sie, B. Pellat, and T. Parra, "A 5.4 mW/0.07 $mm^2$ 2.4 GHz front-end receiver in 90 nm CMOS for IEEE 802.15.4 WPAN standard," *IEEE J. of Solid-State Circuits*, vol. 43, no. 6, pp. 1372-1383, June 2008) and the receiver RF front-end 1800. Columns 2402 to 2408 show the measured results of the four conventional receivers respectively. Column 2410 shows the measured results of the receiver RF front-end 1800. The power consumption for the total receiver RF front-end 1800 including the amplifier 1802, transconductor 1804, I/Q mixer 1804, and LO buffers 1812a, 1812b is 490 μW (0.49 mW) at 1-V supply voltage. In comparison with the results of the four conventional receivers, the receiver front-end 1800 shows favorable performance.

In one embodiment, the receiver RF front-end 1800 may be a low-voltage ultra-low-power 401-406 MHz MedRadio receiver RF front-end targeted for wearable sensor applications. The receiver RF front-end 1800 may be an ultra-low-power 401-406 MHz Medical Device Radiocommunication Service (MedRadio) receiver RF front-end for biomedical telemetry applications implemented using 0.18-μm CMOS technology with a 1-V supply voltage. The receiver RF front-end 1800 employs the amplifier 300 (e.g. complementary current-reuse low-noise amplifier (CCRLNA)) which shows enhanced noise and linearity performance in comparison to the well-known source degeneration cascode LNA (SDCLNA) 100 at equal power consumption and design conditions. The receiver RF front-end 1500 including the amplifier 1802 (e.g. amplifier/CCRLNA 300), transconductor 1804, I/Q folded mixer 1806, and LO buffers 1812a, 1812b can achieve a conversion gain of 28.7 dB, NF of 5.5 dB, and IIP3 of −25 dBm while consuming less than 500 μW (e.g. 490 μW) from a 1-V supply voltage and occupy 0.7 $mm^2$ of core die area. The receiver RF front-end 1800 exhibits enhanced noise and linearity performance.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

In this document, the following documents are cited:

[1] I. Nam, B. Kim, and K. Lee, "CMOS RF amplifier and mixer circuits utilizing complementary characteristics of parallel combined NMOS and PMOS devices," *IEEE Trans. Microw. Theory and Tech.*, vol. 53, no. 5, pp. 1662-1671, May 2005

[2] "A 1V wireless transceiver for an ultra-low-power SoC for biotelemetry applications," JSSC2008

[3] "A 3 GHz subthreshold CMOS low noise amplifier" RFIC2006

[4] "A subthreshold low-noise amplifier optimized for ultra-low-power applications in the ISM band," TMTT2008

[5] "A novel ultra-low power (ULP) low noise amplifier using differential inductor feedback" ESSCIRC2006

[6] R. van Langevelde, M. van Elzakker, D. van Goor, H. Termeer, J. Moss, and A. J. Davie, "An ultra-low-power 868/915 MHz RF transceiver for wireless sensor network applications," in *Proc. IEEE RF Integ. Circuits Symp.*, 2009, pp. 113-116

[7] B. G. Perumana, R. Mukhopadhyay, S. Chakraborty, C.-H. Lee, and J. Laskar, "A low-power fully monolithic subthreshold CMOS receiver with integrated LO generation for 2.4 GHz wireless PAN applications," *IEEE J. of Solid-State Circuits*, vol. 43, no. 10, pp. 2229-2238, October 2008

[8] Y. Feng, G. Takemura, S. Kawaguchi, and P. Kinget, "Design of a high performance 2-GHz direct-conversion front-end with a single-ended RF input in 0.13 um CMOS," *IEEE J. of Solid-State Circuits*, vol. 44, no. 5, pp. 1380-1390, May 2009

[9] M. Camus, B. Butaye, L. Garcia, M. Sie, B. Pellat, and T. Parra, "A 5.4 mW/0.07 mm² 2.4 GHz front-end receiver in 90 nm CMOS for IEEE 802.15.4 WPAN standard," *IEEE J. of Solid-State Circuits*, vol. 43, no. 6, pp. 1372-1383, June 2008

What is claimed is:

1. An amplifier, comprising:
an input terminal;
a first transistor of a first conductivity and a second transistor of a second conductivity, each transistor comprising a source terminal, a gate terminal and a drain terminal respectively, the source terminal of the first transistor being coupled to the source terminal of the second transistor, and the gate terminal of the first transistor and the gate terminal of the second transistor being coupled to the input terminal;
an output terminal coupled to the drain terminal of the first transistor and the drain terminal of the second transistor;
further comprising a first depletion capacitor coupled between the gate terminal and the source terminal of the first transistor;
further comprising a first bias voltage input terminal adapted to provide a first bias voltage to the gate terminal of the first transistor;
wherein the first bias voltage input terminal is provided between the negative terminal of the first gate capacitor and the positive terminal of the first depletion capacitor.

2. The amplifier of claim 1, wherein the first depletion capacitor comprises a positive terminal and a negative terminal, wherein the positive terminal of the first depletion capacitor is coupled to the gate terminal of the first transistor and the negative terminal of the first depletion capacitor is coupled to the source terminal of the first transistor.

3. The amplifier of claim 1, further comprising a second depletion capacitor coupled between the gate terminal and the source terminal of the second transistor.

4. The amplifier of claim 3, wherein the second depletion capacitor comprises a positive terminal and a negative terminal, wherein the positive terminal of the second depletion capacitor is coupled to the gate terminal of the second transistor and the negative terminal of the second depletion capacitor is coupled to the source terminal of the second transistor.

5. The amplifier of claim 1, further comprising a first resistor coupled between the drain terminal of the first transistor and a first voltage reference point.

6. The amplifier of claim 5, wherein the first resistor comprises a first terminal and a second terminal, wherein the first terminal of the first resistor is coupled to the drain terminal of the first transistor and the second terminal of the first resistor is coupled to the first voltage reference point.

7. The amplifier of claim 1, further comprising a second resistor coupled between the drain terminal of the second transistor and a second voltage reference point.

8. The amplifier of claim 7, wherein the second resistor comprises a first terminal and a second terminal, wherein the first terminal of the second resistor is coupled to the drain terminal of the second transistor and the second terminal of the second resistor is coupled to the second voltage reference point.

9. The amplifier of claim 1, further comprising a first output capacitor coupled between the drain terminal of the first transistor and the output terminal.

10. The amplifier of claim 9, wherein the first output capacitor comprises a positive terminal and a negative terminal, wherein the positive terminal of the first output capacitor is coupled to the drain terminal of the first transistor and the first terminal of the first resistor and the negative terminal of the first output capacitor is coupled to the output terminal.

11. The amplifier of claim 1, further comprising a second output capacitor coupled between the drain terminal of the second transistor and the output terminal.

12. The amplifier of claim 11, wherein the second output capacitor comprises a positive terminal and a negative terminal, wherein the positive terminal of the second output capacitor is coupled to the drain terminal of the second transistor and the first terminal of the second resistor and the negative terminal of the second output capacitor is coupled to the output terminal.

13. The amplifier of claim 4, further comprising:
a gate inductor comprising a first terminal and a second terminal;
a first gate capacitor comprising a positive terminal and a negative terminal;
a second gate capacitor comprising a positive terminal and a negative terminal;
wherein the first terminal of the gate inductor is coupled to the input terminal, and the second terminal of the gate inductor is coupled to the positive terminal of the first gate capacitor and the positive terminal of the second gate capacitor;
wherein the negative terminal of the first gate capacitor is coupled to the gate terminal of the first transistor and the positive terminal of the first depletion capacitor;
wherein the negative terminal of the second gate capacitor is coupled to the gate terminal of the second transistor and the positive terminal of the second depletion capacitor.

14. The amplifier of claim 4, further comprising:
a source inductor comprising a first terminal and a second terminal;
a source capacitor comprising a positive terminal and a negative terminal;
wherein the first terminal of the source inductor is coupled to the source terminal of the first transistor, the negative terminal of the first depletion capacitor, the source terminal of the second transistor and the negative terminal of the second depletion capacitor;
wherein the second terminal of the source inductor is coupled to the positive terminal of the source capacitor;
wherein the negative terminal of the source capacitor is coupled to the second voltage reference point.

15. The amplifier of claim 1, further comprising a second bias voltage input terminal adapted to provide a second bias voltage to the gate terminal of the second transistor.

16. A transceiver comprising an amplifier of claim 1.

17. An amplifier, comprising:
an input terminal and an output terminal, wherein the input terminal and the output terminal are single-ended with equal phases for a signal; and
a core configured to operate as a differential mode, the core comprising a first transistor of a first conductivity and a second transistor of a second conductivity, each transistor comprising a source terminal, a gate terminal and a drain terminal respectively, the source terminal of the first transistor being coupled to the source terminal of the second transistor, and the gate terminal of the first transistor and the gate terminal of the second transistor being coupled to the input terminal;
a first depletion capacitor coupled between the gate terminal and the source terminal of the first transistor;
a first bias voltage input terminal adapted to provide a first bias voltage to the gate terminal of the first transistor;
wherein the first bias voltage input terminal is provided between the negative terminal of the first gate capacitor and the positive terminal of the first depletion capacitor.

* * * * *